(12) United States Patent
Shin et al.

(10) Patent No.: US 12,004,408 B2
(45) Date of Patent: Jun. 4, 2024

(54) DISPLAY DEVICE AND ELECTRONIC DEVICE INCLUDING THE SAME

(71) Applicant: Samsung Display Co., Ltd., Yongin-si (KR)

(72) Inventors: Jaiku Shin, Hwaseong-si (KR); Jinhyoung Kim, Seoul (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 32 days.

(21) Appl. No.: 17/723,063

(22) Filed: Apr. 18, 2022

(65) Prior Publication Data

US 2023/0045544 A1    Feb. 9, 2023

(30) Foreign Application Priority Data

Aug. 4, 2021    (KR) .......................... 10-2021-0102756

(51) Int. Cl.
| | |
|---|---|
| *H10K 59/65* | (2023.01) |
| *G02F 1/1333* | (2006.01) |
| *H10K 50/87* | (2023.01) |
| *H10K 77/10* | (2023.01) |
| *H10K 102/00* | (2023.01) |

(52) U.S. Cl.
CPC ....... *H10K 59/65* (2023.02); *G02F 1/133305* (2013.01); *G02F 1/133308* (2013.01); *H10K 50/87* (2023.02); *H10K 77/111* (2023.02); *G02F 2201/503* (2013.01); *H10K 2102/311* (2023.02)

(58) Field of Classification Search
None
See application file for complete search history.

(56) References Cited

U.S. PATENT DOCUMENTS

| | | | |
|---|---|---|---|
| 9,798,359 B2 | 10/2017 | Seo et al. | |
| 11,016,527 B2 | 5/2021 | Park et al. | |
| 11,069,265 B2 | 7/2021 | Jung et al. | |
| 2020/0117034 A1* | 4/2020 | Yin | .......... G02F 1/136209 |
| 2021/0141124 A1 | 5/2021 | Park et al. | |

(Continued)

FOREIGN PATENT DOCUMENTS

| | | |
|---|---|---|
| KR | 10-2016-0124414 A | 10/2016 |
| KR | 10-2019-0064552 A | 6/2019 |
| KR | 10-2019-0127074 A | 11/2019 |

(Continued)

OTHER PUBLICATIONS

PCT International Search Report (ISR) dated Aug. 11, 2022, for PCT/KR2022/006817, 3 pages.

*Primary Examiner* — Phu Vu
(74) *Attorney, Agent, or Firm* — Lewis Roca Rothgerber Christie LLP

(57) ABSTRACT

A display device includes: a display panel including a first area, a bending area, and a second area arranged along a first direction, the second area being located underneath the first area when the bending area is bent; and a spacer between the first area and the second area, and including: a first part; and a second part protruding from the first part in the first direction. Opposite sides of the second part in a second direction that crosses the first direction define steps that are stepped from the first part, and the steps are located at an outside of the second area in a plan view.

20 Claims, 20 Drawing Sheets

(56) References Cited

U.S. PATENT DOCUMENTS

2021/0259102 A1   8/2021  Shin et al.
2021/0318571 A1 * 10/2021  Tseng ................ G02F 1/133308

FOREIGN PATENT DOCUMENTS

| KR | 10-2020-0018282 A | 2/2020 | | |
|----|-------------------|--------|---|---|
| KR | 10-2020-0052621 A | 5/2020 | | |
| KR | 10-2020-0101224 A | 8/2020 | | |
| KR | 10-2021-0056484 A | 5/2021 | | |
| KR | 10-2021-0104516 A | 8/2021 | | |
| WO | WO-2021162298 A1 * | 8/2021 | ........... | G02F 1/1333 |

* cited by examiner

DISPLAY DEVICE AND ELECTRONIC DEVICE INCLUDING THE SAME

CROSS-REFERENCE TO RELATED APPLICATIONS

This application claims priority to and the benefit of Korean Patent Application No. 10-2021-0102756, filed on Aug. 4, 2021, in the Korean Intellectual Property Office, the entire disclosure of which is incorporated by reference herein.

BACKGROUND

Aspects of embodiments of the present disclosure relate to a display device, and an electronic device including the same.

In general, a display device includes a display module for displaying an image, and a support for supporting the display module. The display module includes a display panel that displays an image, a window disposed on the display panel to protect the display panel from external scratches and impacts, and a protection layer disposed under the display panel to protect the display panel from external impacts. The support has a strength that is higher than that of the display module, and supports the display module.

In recent years, flexible display devices that may be deformed in various shapes have been developed together with the development of the technologies of the display devices. The flexible display device includes a flexible display module that may be folded and/or rolled. In the flexible display module, the support disposed under the display module that is folded with respect to a folding axis may have a structure that is folded together with the display module.

The above information disclosed in this Background section is for enhancement of understanding of the background of the present disclosure, and therefore, it may contain information that does not constitute prior art.

SUMMARY

One or more embodiments of the present disclosure are directed to a display device that may prevent or substantially prevent damage to a display panel that may be caused due to an impact when the display device is dropped or falls, and an electronic device including the same.

According to one or more embodiments of the present disclosure a display device includes: a display panel including a first area, a bending area, and a second area arranged along a first direction, the second area being configured to be located underneath the first area when the bending area is bent; and a spacer between the first area and the second area, and including: a first part; and a second part protruding from the first part in the first direction. Opposite sides of the second part in a second direction that crosses the first direction define steps that are stepped from the first part, and the steps are located at an outside of the second area in a plan view.

In an embodiment, the second area may include: a mounting part extending in the second direction; and a bonding part protruding from the mounting part in the first direction, and opposite sides of the bonding part in the second direction may define panel steps that are stepped from the mounting part.

In an embodiment, the steps may be spaced from the panel steps in the second direction.

In an embodiment, the second part may extend in the second direction to cross the panel steps in the second direction; a portion of the mounting part may extend further in the second direction than the bonding part; and the steps may be adjacent in the first direction to the portion of the mounting part that extends further in the second direction than the bonding part.

In an embodiment, the steps may have inclined surfaces that form an obtuse angle with one side of the second part that extends in the second direction while overlapping with the bonding part.

In an embodiment, the display device may further include resin layers spaced from the panel steps in a plan view, and the resin layers may cover portions of edges of the spacer that are spaced from the panel steps, respectively.

In an embodiment, the resin layers may overlap with the steps in a plan view.

In an embodiment, the resin layers may not overlap with the steps in a plan view.

In an embodiment, the display device may further include: a driving part under the mounting part; a printed circuit board connected to the bonding part; and an insulation tape under the second area to cover the driving part, and extending to a lower side of the printed circuit board.

In an embodiment, the insulation tape may include: a first extension part under the mounting part and extending in the second direction; a second extension part under the bonding part, and protruding from the first extension part in the first direction; and a third extension part under a portion of the printed circuit board, and protruding from the second extension part in the first direction.

In an embodiment, the display device may further include resin layers spaced from the panel steps in a plan view, and the resin layers may cover portions of edges of the spacer that are spaced from the panel steps, respectively, and portions of edges of the first extension part that are spaced from the panel steps, respectively.

In an embodiment, portions of the first extension part that are adjacent to opposite sides of the second extension part, which are opposite to each other in the second direction, may define dummy steps having a shape that is recessed in the first direction to be stepped, and side surfaces of the dummy steps that face the opposite sides of the second extension part may have inclined surfaces and are adjacent to the panel steps.

In an embodiment, intervals between the side surfaces of the dummy steps and the opposite sides of the second extension part may become smaller as they become closer to the bending area.

In an embodiment, the spacer may further include a third part that protrudes from the first part in an opposite direction from that of the second part in the first direction, and is stepped from the first part. The first part may overlap with the mounting part, the third part may overlap with the bending area, and the second part may overlap with the bonding part.

In an embodiment, the second part and the third part may have lengths in the second direction that are smaller than that of the first part, and the third part may have a length in the second direction that is smaller than that of the second part.

In an embodiment, the display device may further include: a first support plate under the first area; a second support plate under the first support plate; and a heat dissipating layer between the first support plate and the second support plate. The spacer may be located under the second support plate, and one side of the spacer that is adjacent to the bending area may overlap with one side of the second support plate that is adjacent to the bending area.

According to one or more embodiments of the present disclosure, a display device includes: a display panel including a first area, a bending area, and a second area arranged along a first direction, the second area being configured to be located underneath the first area when the bending area is bent; and a spacer between the first area and the second area, and including: a first part extending to an outside of the second area; and a second part protruding from the first part in the first direction. The second area includes: a mounting part overlapping with the first part in a plan view; and a bonding part protruding from the mounting part in the first direction, and overlapping with the second part. Opposite sides of the second part in a second direction that crosses the first direction define steps that are stepped from the first part, and the bonding part is between the steps in the second direction in a plan view.

In an embodiment, the display device may further include: a printed circuit board connected to one side of the second area; an insulation tape under the second area and extending to a lower side of a portion of the printed circuit board; and a resin layer covering portions of edges of the spacer that are spaced apart from panel steps, respectively, and portions of edges of the insulation tape that are spaced apart from the panel steps, respectively, in a plan view.

In an embodiment, the resin layer may overlap with at least one of the steps in a plan view.

According to one or more embodiments of the present disclosure, an electronic device includes: a display device having a first hole area through which an optical signal passes; an electronic optical module under the display device and overlapping with the first hole area, the electronic optical module being configured to receive the optical signal; and a case configured to accommodate the display device and the electronic optical module. The display device includes: a display panel including a first area, a bending area, and a second area arranged along a first direction, the second area being configured to be located underneath the first area when the bending area is bent; and a spacer between the first area and the second area, and including: a first part; and a second part protruding from the first part in the first direction. Opposite sides of the second part in a second direction that crosses the first direction define steps that are stepped from the first part, and the steps are located at an outside of the second area in a plan view.

BRIEF DESCRIPTION OF THE FIGURES

The above and other aspects and features of the present disclosure will be more clearly understood from the following detailed description of the illustrative, non-limiting embodiments with reference to the accompanying drawings.

DETAILED DESCRIPTION

Figure 1:
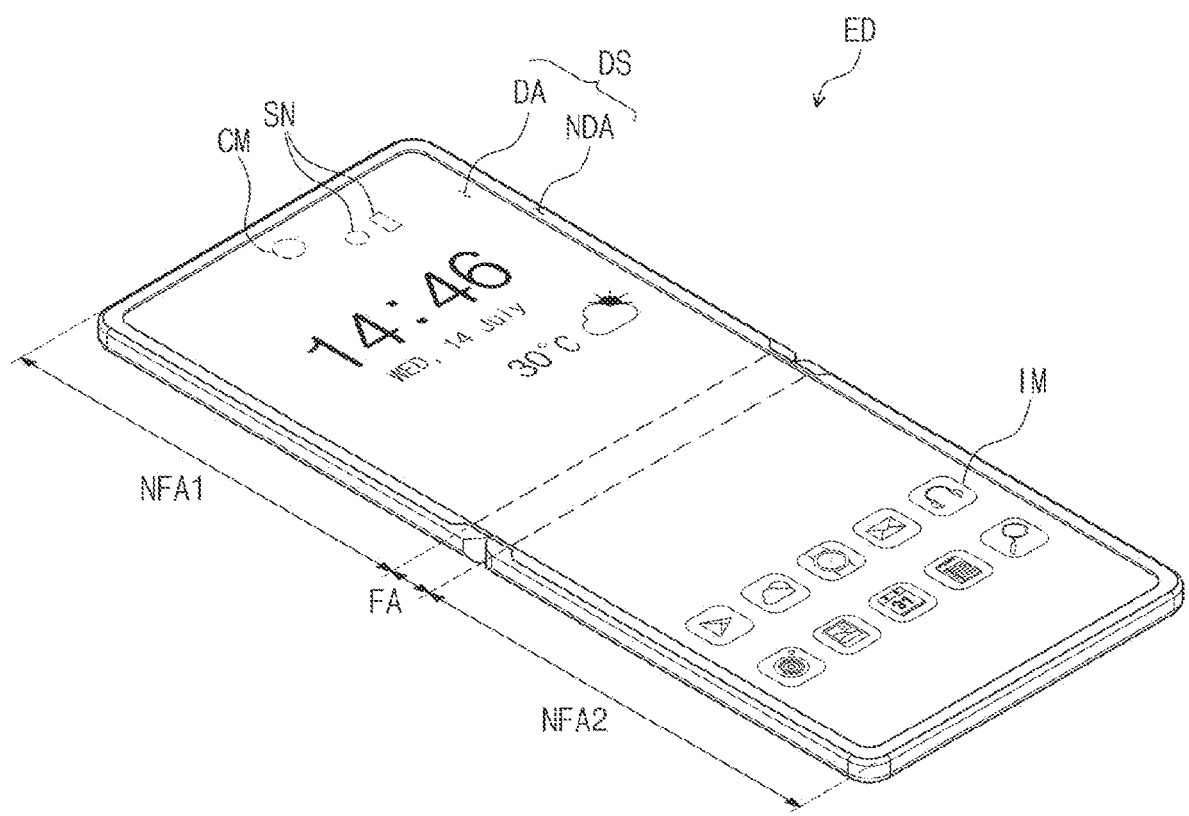
FIG. 1 is a perspective view of an electronic device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
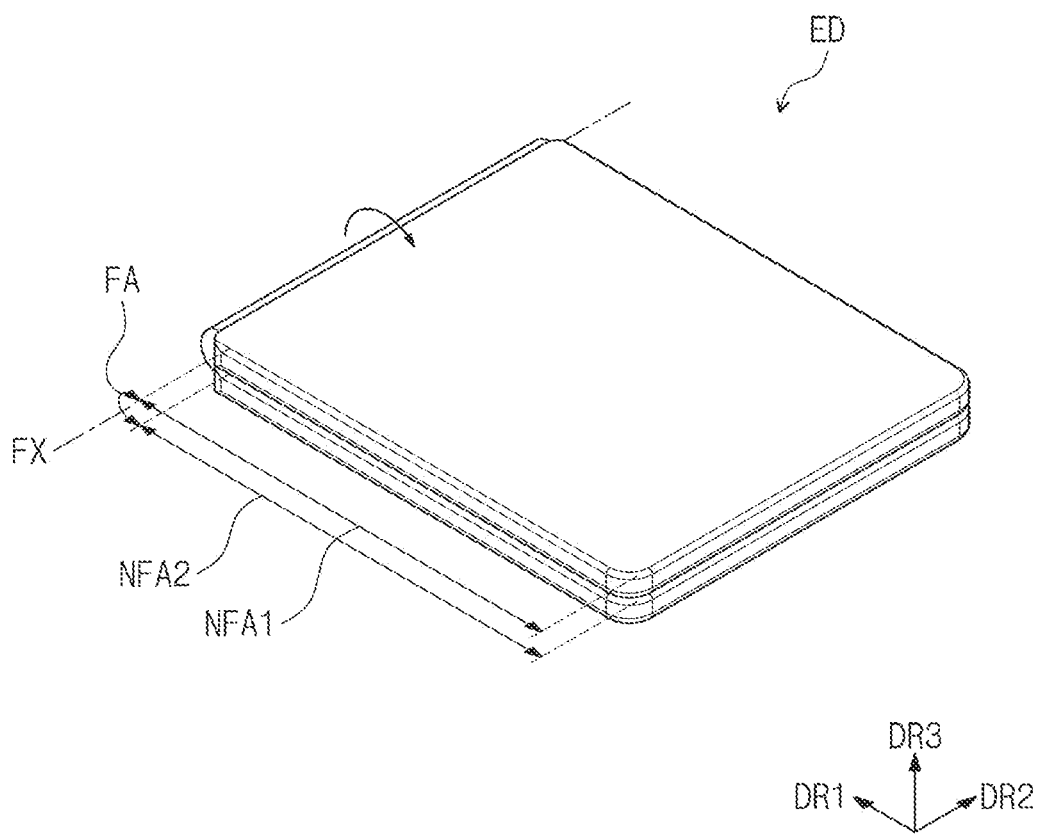
FIG. 2 is a view illustrating a folding state of the electronic device illustrated in FIG. 1.

FIG. 1 is a perspective view of an electronic device according to an embodiment of the present disclosure. FIG. 2 is a view illustrating a folding state of the electronic device illustrated in FIG. 1.

Referring to FIG. 1, an electronic device ED according to an embodiment of the present disclosure may have a rectangular shape having long edges (e.g., long sides) extending in a first direction DR1, and short edges (e.g., short sides) extending in a second direction DR2 that crosses the first direction DR1. However, the present disclosure is not limited thereto, and the electronic device ED may have various suitable shapes, for example, such as a circular shape, a polygonal shape, and the like. The electronic device ED may be a flexible electronic device.

Hereinafter, a direction that perpendicularly or substantially perpendicularly crosses a plane defined by the first direction DR1 and the second direction DR2 is defined as a third direction DR3. Furthermore, as used in the specification, the expression "when viewed on a plane" (e.g., in a plan view) may be defined as a state that is viewed from the third direction DR3. Furthermore, as used in the specification, the term "overlap" or "overlapping" may refer to a state in which two members or configurations overlap with each other when viewed on the plane (e.g., in the plan view).

The electronic device ED may include a folding area FA, and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The first non-folding area NFA1, the folding area FA, and the second non-folding area NFA2 may be arranged along the first direction DR1.

Although one folding area FA and the two non-folding areas NFA1 and NFA2 are illustrated as an example, the numbers of the folding area FA and the non-folding areas NFA1 and NFA2 are not limited thereto. For example, in some embodiments, the electronic device ED may include a plurality of non-folding areas of two or more, and a plurality of folding areas disposed between the non-folding areas.

An upper surface of the electronic device ED may be defined as a display surface DS, and may have a plane defined by the first direction DR1 and the second direction DR2. Through the display surface DS, images IM generated by the electronic device ED may be provided to a user.

The display surface DS may include a display area DA, and a non-display area NDA around (e.g., adjacent to) the display area DA. The display area DA may display an image (e.g., the images IM), and the non-display area NDA may not display an image. The non-display area NDA may define an edge of the electronic device, which surrounds (e.g., around a periphery of) the display area DA, and may be printed with a suitable color (e.g., a specific or predetermined color).

The electronic device ED may include a plurality of sensors SN, and at least one camera CM. The sensors SN and the camera CM may be adjacent to an edge of the electronic device ED. The sensors SN and the camera CM may be disposed at (e.g., in or on) the display area DA that is adjacent to the non-display area NDA. The sensors SN and the camera CM may be disposed at (e.g., in or on) the first non-folding area NFA1, but the present disclosure is not limited thereto, and disposition locations of the sensors SN and the camera CM may be variously modified as needed or desired.

As an example, the sensors SN may include (e.g., may be) a proximity sensor, but the kinds of the sensors SN are not limited thereto. The camera CM may be used to photograph an external image.

Referring to FIG. 2, the electronic device ED may be a foldable electronic device ED that is folded and/or unfolded. For example, the folding area FA may be bent with respect to a folding axis FX that is parallel to or substantially parallel to the second direction DR2, and thus, the electronic device ED may be folded relative to the folding axis FX. The folding axis FX may be defined as a short axis that is parallel to or substantially parallel to a short edge (e.g., a short side) of the electronic device ED, but the present disclosure is not limited thereto, and for example, in some embodiments, the folding axis FX may be defined as a long axis that is parallel to or substantially parallel to a long edge (e.g., a long side) of the electronic device ED.

When the electronic device ED is folded, the first non-folding area NFA1 and the second non-folding area NFA2 may face each other, and thus, the electronic device ED may be in-folded such that the display surface DS is not exposed to the outside. However, the present disclosure is not limited thereto. For example, in some embodiments, the electronic device ED may be out-folded relative to (e.g., with respect to) the folding axis FX, such that the display surface DS is exposed to the outside.

Figure 3:
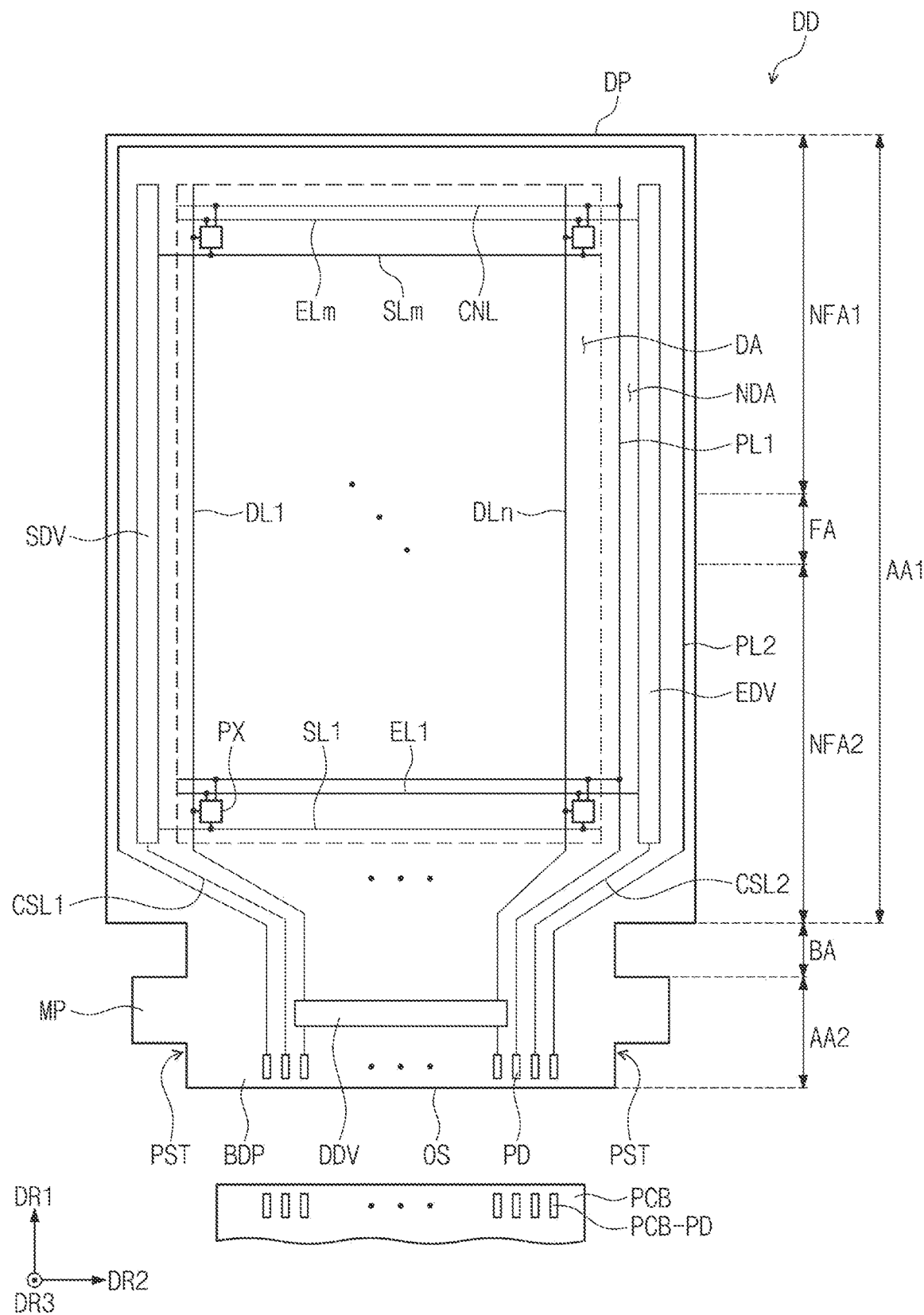
FIG. 3 is a plan view of a display device used in the electronic device illustrated in FIG. 1.

FIG. 3 is a plan view of a display device used in the electronic device illustrated in FIG. 1.

Referring to FIG. 3, a display device DD may include a display panel DP, a scan driver SDV, a data driver DDV, an emission driver EDV, and a printed circuit board PCB.

The display panel DP according to an embodiment of the present disclosure may be a light emitting display panel. For example, the display panel DP may be an organic light emitting display panel, or an inorganic light emitting display panel. A light emitting layer of the organic light emitting display panel may include an organic light emitting material. A light emitting layer of the inorganic light emitting display panel may include quantum dots and quantum rods. Hereinafter, for convenience, the display panel DP will be described in more detail as an organic light emitting display panel, but the present disclosure is not limited thereto.

The display panel DP may be a flexible display panel. For example, the display panel DP may include a plurality of electronic elements disposed on a flexible substrate. The display panel DP may extend to be longer in the first direction DR1 than in the second direction DR2. The display panel DP may have a plane defined by the first and second directions DR1 and DR2.

The display panel DP may include a first area AA1, a second area AA2, and a bending area BA disposed between the first area AA1 and the second area AA2. The bending area BA may extend in the second direction DR2, and the first area AA1, the bending area BA, and the second area AA2 may be arranged along the first direction DR1.

The first area AA1 may extend in the first direction DR1, and may have long edges (e.g., long sides) that are opposite to each other in the second direction DR2. Lengths of the bending area BA and the second area AA2 may be smaller than a length of the first area AA1 with respect to the second direction DR2.

The first area AA1 may include the display area DA, and the non-display area NDA around (e.g., adjacent to) the display area DA. The non-display area NDA may surround (e.g., around a periphery of) the display area DA. The display area DA may be an area that displays an image, and the non-display area NDA may be an area that does not display an image. The second area AA2 and the bending area BA may be areas that also do not display an image.

The first area AA1, when viewed from the second direction DR2, may include the first non-folding area NFA1, the second non-folding area NFA2, and the folding area FA between the first non-folding area NFA1 and the second non-folding area NFA2.

One side OS of the second area AA2, which is spaced apart from the bending area BA in the first direction DR1, may extend in the second direction DR2. The one side OS of the second area AA2 may define a lower end of the second area AA2. Opposite ends of the one side OS that are opposite to each other in the second direction DR2 may be defined as panel steps PST having stepped shapes. In other words, the opposite ends of the one side OS may have step shapes.

The second area AA2 may include a mounting part MP extending in the second direction DR2, and a bonding part BDP protruding from the mounting part MP in the first direction DR1. The bonding part BDP may protrude toward the printed circuit board PCB from the mounting part MP in the first direction DR1. The data driver DDV may be disposed on the mounting part MP, and pads PD may be disposed on the bonding part BDP.

A length of the mounting part MP with respect to the second direction DR2 may be larger than the length of the bending area BA. Opposite sides of the bonding part BDP that are opposite to each other in the second direction DR2 may be stepped with the mounting part MP to define the above-described panel steps PST. The display panel DP may include a plurality of pixels PX, a plurality of scan lines SL1 to SLm, a plurality of data lines DL1 to DLn, a plurality of light emitting lines EL1 to ELm, first and second control lines CSL1 and CLS2, a first power line PL1, a second power line PL2, a plurality of connection lines CNL, and a plurality of pads PD. Here, m and n are natural numbers. The pixels PX may be disposed at (e.g., in or on) the display area DA, and may be connected to the scan lines SL1 to SLm, the data lines DL1 to DLn, and the light emitting lines EL1 to ELm.

The scan driver SDV and the emission driver EDV may be disposed at (e.g., in or on) the non-display area NDA. The scan driver SDV and the emission driver EDV may be disposed at (e.g., in or on) the non-display areas NDA that are adjacent to the long edges (e.g., the long sides) of the first area AA1, respectively. The data driver DDV may be disposed at (e.g., in or on) the second area AA2. For example, the data driver DDV may be manufactured in a form of an integrated circuit chip, and may be mounted on the second area AA2.

The scan lines SL1 to SLm may extend in the second direction DR2, and may be connected to the scan driver SDV. The data lines DL1 to DLn may extend in the first direction DR1, and may be connected to the data driver DDV via the bending area BA. The light emitting lines EL1 to ELm may extend in the second direction DR2, and may be connected to the emission driver EDV.

The first power line PL1 may extend in the first direction DR1, and may be disposed at (e.g., in or on) the non-display area NDA. The first power line PL1 may be disposed between the display area DA and the emission driver EDV as shown in FIG. 3, but the present disclosure is not limited thereto, and in some embodiments, the first power line PL1 may be disposed between the display area DA and the scan driver SDV.

The first power line PL1 may extend to the second area AA2 via the bending area BA. The first power line PL1, when viewed on the plane (e.g., in a plan view), may extend toward a lower end of the second area AA2. The first power line PL1 may receive a first voltage.

The second power line PL2 may be disposed at (e.g., in or on) the non-display areas NDA that are adjacent to the long edges (e.g., the long sides) of the first area AA1, and may extend around the non-display area NDA opposite to the second area AA2 with the display area DA being interposed therebetween. The second power line PL2 may be disposed at (e.g., in or on) an outside of the scan driver SDV and the emission driver EDV.

The second power line PL2 may extend to the second area AA2 via the bending area BA. The second power line PL2 may extend in the first direction DR1 in the second area AA2 with the data driver DDV being interposed between ends of the second power line PL2 at (e.g., in or on) the second area AA2. The second power line PL2, when viewed on the plane (e.g., in a plan view), may extend toward a lower end of the second area AA2.

The second power line PL2 may receive a second voltage having a level that is lower than the first voltage. For example, the second power line PL2 may extend to the display area DA to be connected to the pixels PX, and the second voltage may be provided to the pixels PX through the second power line PL2. However, the present disclosure is not limited thereto, and for example, the connection relationship of the second power line PL2 may be variously modified as needed or desired.

The connection lines CNL may extend in the second direction DR2, and may be arranged along the first direction DR1. The connection lines CNL may be connected to the first power line PL1 and the pixels PX. The first voltage may be applied to the pixels PX through the first power line PL1 and the connection lines CNL connected to the first power line PL1.

The first control line CSL1 may be connected to the scan driver SDV, and may extend toward a lower end of the second area AA2 via the bending area BA. The second control line CSL2 may be connected to the emission driver EDV, and may extend toward the lower end of the second area AA2 via the bending area BA. The data driver DDV may be disposed between the first control line CSL1 and the second control line CSL2.

When viewed on the plane (e.g., in a plan view), the pads PD may be disposed to be adjacent to the lower end of the second area AA2. The pads PD may be disposed between the panel steps PST. The data driver DDV, the first power line PL1, the second power line PL2, the first control line CSL1, and the second control line CSL2 may be connected to the pads PD.

The data lines DL1 to DLn may be connected to corresponding ones of the pads PD through the data driver DDV. For example, the data lines DL1 to DLn may be connected to the data driver DDV, and the data driver DDV may be connected to the corresponding ones of the pads PD corresponding to the data lines DL1 to DLn, respectively.

The printed circuit board PCB may be connected to the one side OS of the second area AA2. For example, the printed circuit board PCB may be connected to the bonding part BDP. The printed circuit board PCB may be connected to the pads PD disposed on the bonding part BDP. Connection pads PCB-PD may be disposed on the printed circuit board PCB, and the connection pads PCB-PD may be connected to the pads PD.

A timing controller may be disposed on the printed circuit board PCB. The timing controller may be connected to the pads PD through the printed circuit board PCB. The timing controller may control operations of the scan driver SDV, the data driver DDV, and the emission driver EDV. The timing controller may generate a scan control signal, a data control signal, and an emission control signal.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside, and may convert a data format of the image signals according to a specification of an interface with the data driver DDV to provide the converted image signals to the data driver DDV.

The scan driver SDV may generate a plurality of scan signals in response to the scan control signal. The scan signals may be applied to the pixels PX through the scan lines SL1 to SLm. For example, the scan signals may be sequentially applied to the pixels PX via the scan lines SL1 to SLm.

The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EU to ELm.

The pixels PX may be provided with the data voltages in response to the scan signals. The pixels PX may display the images by emitting light having a luminance corresponding to the data voltages in response to the emission signals. A period of time for emission of the pixels PX may be controlled by the emission signals.

A voltage generator may be disposed on the printed circuit board PCB. The voltage generator may be connected to the pads PD through the printed circuit board PCB. The voltage generator may generate the first voltage and the second voltage. The first voltage and the second voltage may be applied to the first power line PL1 and the second power line PL2, respectively.

Each of the pixels PX may include an organic light emitting element. The first voltage may be applied to one electrode (e.g., an anode electrode) of the organic light emitting element, and the second voltage may be applied to another electrode (e.g., a cathode electrode) of the organic light emitting element. The organic light emitting element may receive the first voltage and the second voltage to be operated.

Figure 4:
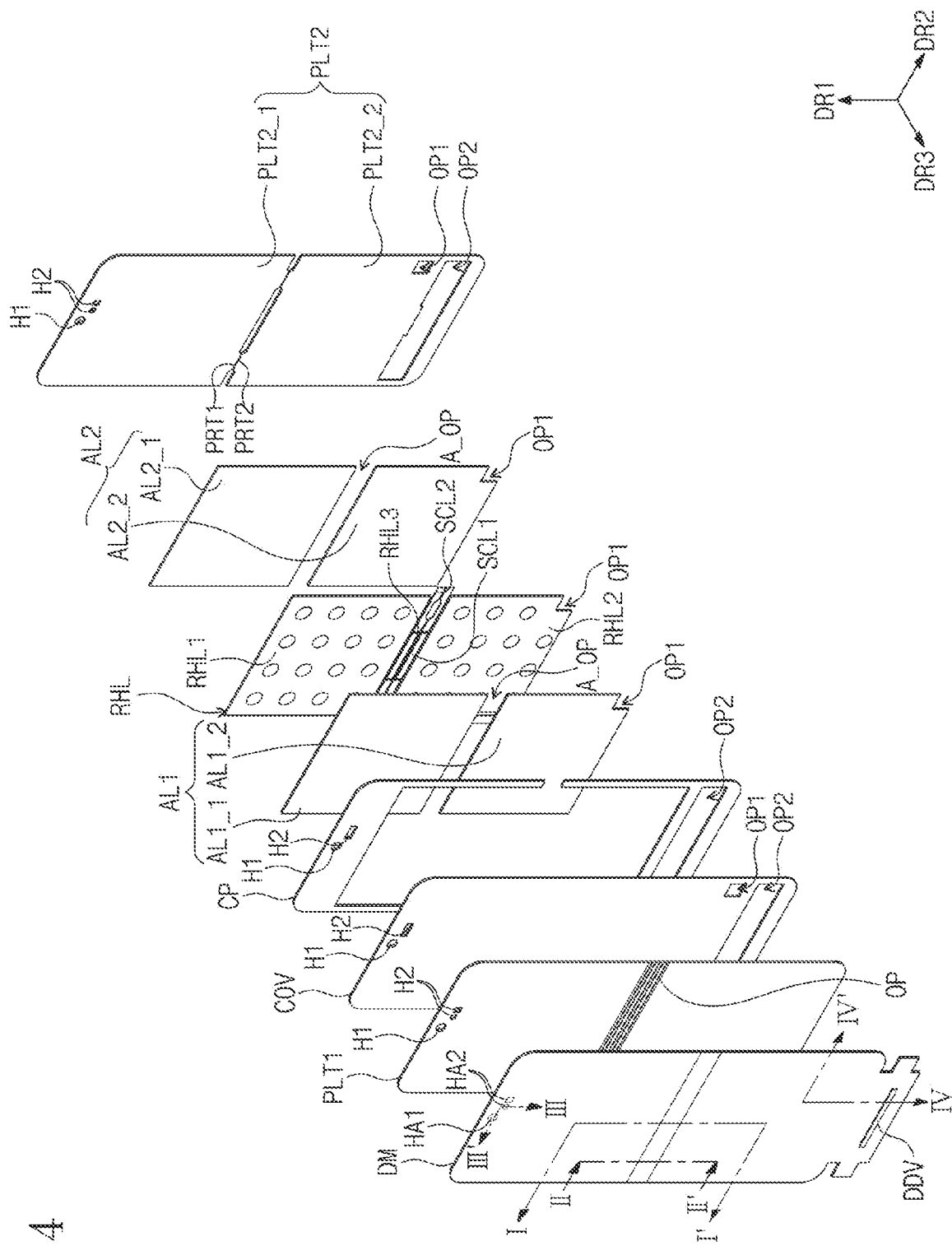
FIG. 4 is an exploded perspective view of the display device used in the electronic device illustrated in FIG. 1.
Figure 5:
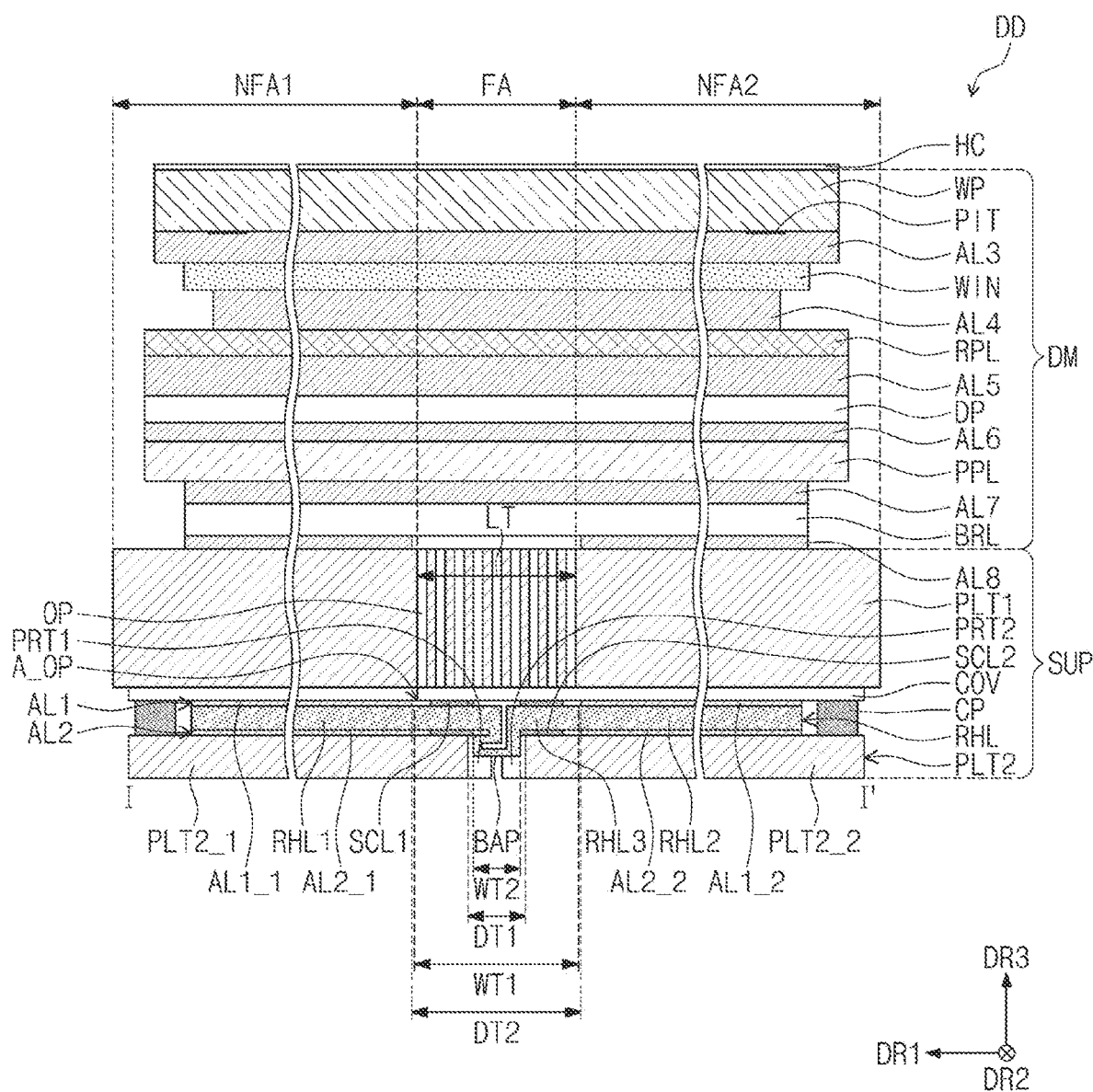
FIG. 5 is a cross-sectional view taken along the line I-I' illustrated in FIG. 4.
Figure 6:
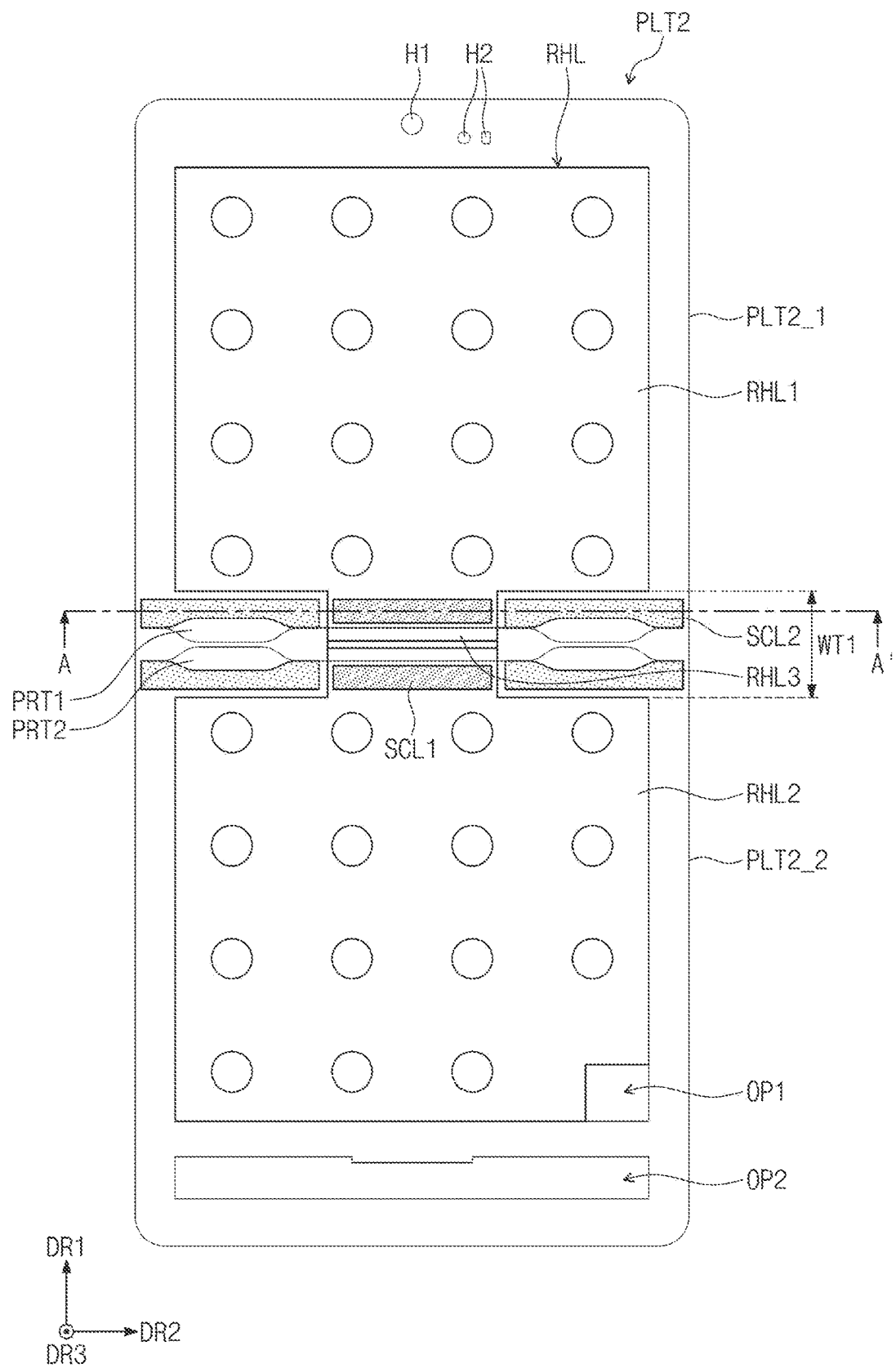
FIG. 6 is a plan view of a heat dissipating layer, a second support plate, and first and second step compensating layers illustrated in FIG. 4.
Figure 7:
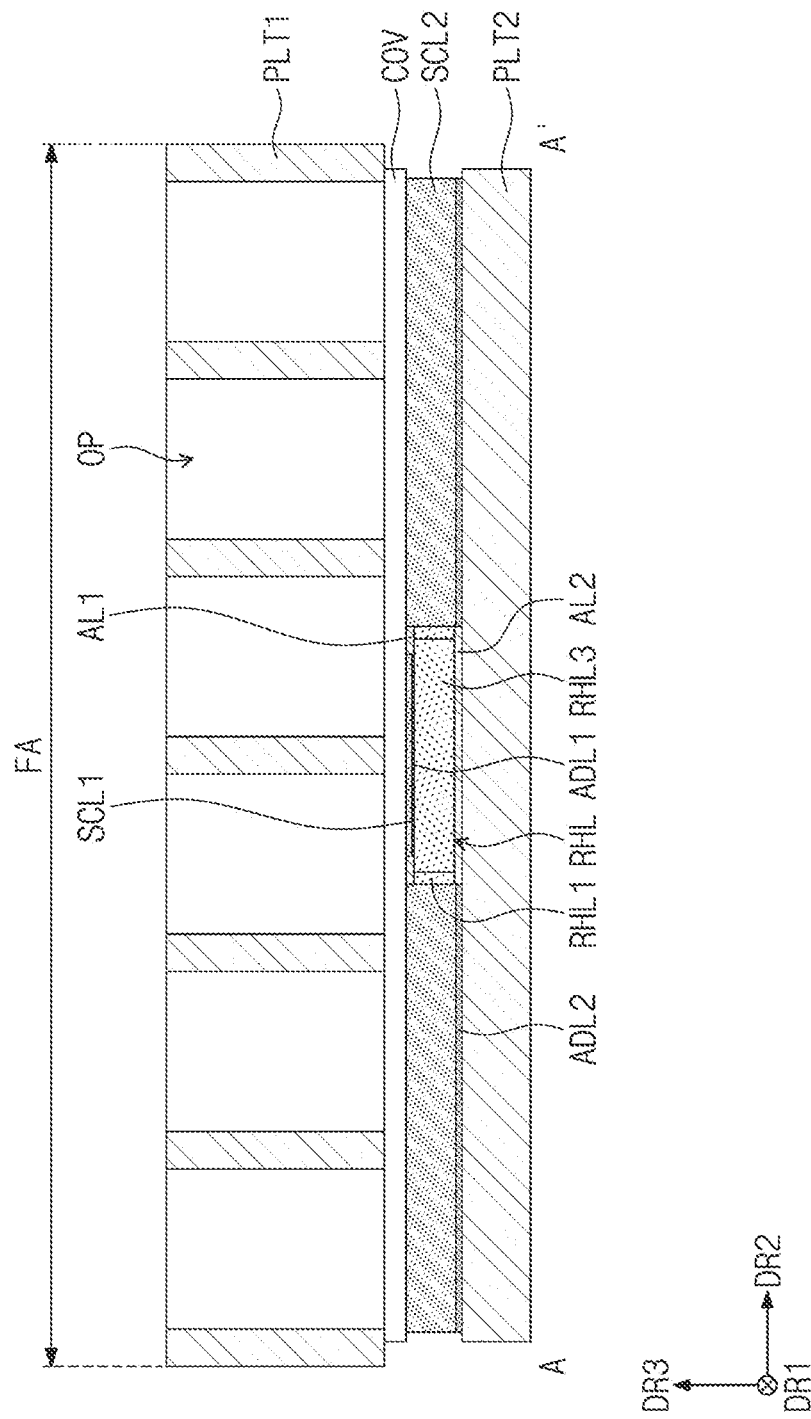
FIG. 7 is a cross-sectional view taken along the line A-A' of FIG. 6.

FIG. 4 is an exploded perspective view of the display device used in the electronic device illustrated in FIG. 1. FIG. 5 is a cross-sectional view taken along the line I-I' illustrated in FIG. 4. FIG. 6 is a plan view of a heat dissipating layer, a second support plate, and first and second step compensating layers illustrated in FIG. 4. FIG. 7 is a cross-sectional view taken along the line A-A' of FIG. 6.

Referring to FIGS. 4 and 5, the display device DD according to an embodiment of the present disclosure may include a display module (e.g., a display or a display layer) DM, and a support SUP disposed under (e.g., underneath) the display module DM. The display module DM may be a flexible display module. The display module DM may include the first non-folding area NFA1, the folding area FA, and the second non-folding area NFA2, which are arranged along the first direction DR1.

At least one first hole area HA1, and a plurality of second hole areas HA2 may be defined in the display module DM. The above-described camera CM may be disposed in the first hole area HA1, and the above-described sensors SN may be disposed in the second hole areas HA2.

The support SUP may support the display module DM under (e.g., underneath) the display module DM. The support SUP may include a first support plate PLT1, a second support plate PLT2, a cover layer COV, a heat dissipating layer RHL, a first bonding layer AL1, a second bonding layer AL2, a step compensating layer CP, a plurality of first step compensating layers SCL1, and a plurality of second step compensating layers SCL2.

The first support plate PLT1 may be disposed under (e.g., underneath) the display module DM to support the display module DM. The first support plate PLT1 may include a material having an elastic coefficient of 60 GPa or more.

The first support plate PLT1 may have a strength that is higher than that of the display module DM. The first support plate PLT1 may include a metallic material, for example, such as stainless steel. For example, the first support plate PLT1 may include SUS 304, but the present disclosure is not limited thereto, and the first support plate PLT1 may include various suitable metallic materials. However, the present disclosure is not limited thereto, and in some embodiments, the first support plate PLT1 may include a nonmetallic material, for example, such as glass or plastic.

A plurality of openings OP may be defined at portions of the first support plate PLT1 that overlaps with the folding area FA. The openings OP may pass through (e.g., may penetrate) the portions of the first support plate PLT1 in the third direction DR3.

The openings OP are defined at the portions of the first support plate PLT1, which overlap with the folding area FA, and thus, flexibility of the first support plate PLT1 that overlaps with the folding area FA may be increased. As a result, the first support plate PLT1 may be easily folded with respect to the folding area FA.

The cover layer COV may be disposed under (e.g., underneath) the first support plate PLT1. The cover layer COV may cover the openings OP defined in the first support plate PLT1, from under (e.g., underneath) the first support plate PLT1. The cover layer COV may have an elastic coefficient that is lower than that of the first support plate PLT1. For example, the cover layer COV may include thermoplastic urethane or rubber, but the material of the cover layer COV is not limited thereto. The cover layer COV may be manufactured in a form of a sheet, and may be attached to the first support plate PLT1.

The second support plate PLT2 may be disposed under (e.g., underneath) the first support plate PLT1. The cover layer COV may be disposed between the first support plate PLT1 and the second support plate PLT2. The second support plate PLT2 may have a strength that is higher than that of the display module DM.

The second support plate PLT2 may include a metallic material, for example, such as stainless steel, but the metallic material of the second support plate PLT2 is not limited thereto. Furthermore, the present disclosure is not limited thereto, and in some embodiments, the second support plate PLT2 may include a nonmetallic material, for example, such as glass or plastic.

The second support plate PLT2 may include a (2_1)-th support plate PLT2_1 that overlaps with the first non-folding area NFA1, and a (2_2)-th support plate PLT2_2 that overlaps with the second non-folding area NFA2. The (2_1)-th support plate PLT2_1 and the (2_2)-th support plate PLT2_2 may be spaced apart from each other under (e.g., underneath) the folding area FA.

The heat dissipating layer RHL may be disposed between the first support plate PLT1 and the second support plate PLT2. In more detail, the heat dissipating layer RHL may be disposed between the cover layer COV and the second support plate PLT2. A portion of the heat dissipating layer RHL that overlaps with the folding area FA may be bent to be disposed between the (2_1)-th support plate PLT2_1 and the (2_2)-th support plate PLT2_2.

The heat dissipating layer RHL may perform a heat dissipating function. For example, the heat dissipating layer RHL may include graphite, but the material of the heat dissipating layer RHL is not limited thereto. Because the heat dissipating layer RHL performs the heat dissipating function together with the first and second support plates PLT1 and PLT2, a heat dissipation performance of the display device DD may be improved.

The heat dissipating layer RHL may have an embossing structure. Circular shapes illustrated in the heat dissipating layer RHL in FIGS. 4 and 6 may indicate convex surfaces of the heat dissipating layer RHL. When the heat dissipating layer RHL has the embossing structure, a surface area of the heat dissipating layer RHL may be expanded. When the surface area of the heat dissipating layer RHL is expanded, the heat dissipation performance may be improved.

Referring to FIGS. 4, 5, and 6, the heat dissipating layer RHL may include a first heat dissipating part RHL1, a second heat dissipating part RHL2, and a third heat dissipating part RHL3 disposed between the first heat dissipating part RHL1 and the second heat dissipating part RHL2. The first heat dissipating part RHL1 may overlap with the first non-folding area NFA1, the second heat dissipating part RHL2 may overlap with the second non-folding area NFA2, and the third heat dissipating part RHL3 may overlap with the folding area FA. As illustrated in FIG. 6, a width of the third heat dissipating part RHL3 in the second direction DR2 may be smaller than widths of the first and second heat dissipating parts RHL1 and RHL2 in the second direction DR2.

As illustrated in FIG. 5, a portion of the third heat dissipating part RHL3 may be bent to be disposed between the (2_1)-th support plate PLT2_1 and the (2_2)-th support plate PLT2_2. The bent portion of the third heat dissipating part RHL3 may be defined as a bending part BAP.

At a portion between two omission indications illustrated in FIG. 5, a horizontal direction may be the first direction DR1. With respect to the first direction DR1, a first distance DT1 between the (2_1)-th support plate PLT2_1 and the (2_2)-th support plate PLT2_2 may be smaller than a first width WT1 of the third heat dissipating part RHL3. With respect to the first direction, a second width WT2 of the bending part BAP may smaller than the first distance DT1. With respect to the first direction DR1, a length LT of the portions of the first support plate PLT1, at which the openings OP are formed, may be smaller than the first width WT1 and larger than the first distance DT1.

The bending part BAP may protrude to a lower side of the first and second heat dissipating parts RHL1 and RHL2, and may be disposed between the (2_1)-th support plate PLT2_1 and the (2_2)-th support plate PLT2_2. For example, the bending part BAP may be bent twice in a downward direction and a leftward direction, but a bending shape of the bending part BAP is not limited thereto. In a state in which the display module DM and the support SUP are unfolded, the bending part BAP may maintain or substantially maintain the bent state.

The first heat dissipating part RHL1, the second heat dissipating part RHL2, and the third heat dissipating part RHL3 may be integrally formed. When a separation type heat dissipating layer is used, the third heat dissipating part RHL3 may not be used, and the first heat dissipating part RHL1 and the second heat dissipating part RHL2 may be used. However, in an embodiment of the present disclosure, because the integral heat dissipating layer RHL is used, the third heat dissipating part RHL3 may be further disposed under (e.g., underneath) the folding area FA. Accordingly, the heat dissipation performance of the display device DD may be improved.

The third heat dissipating part RHL3 may be bent to be disposed under (e.g., underneath) the folding area FA. Accordingly, an area of the heat dissipating layer RHL may be further expanded by the bending part BAP. Because the heat dissipation performance may be proportional to the area of the heat dissipating layer RHL, the heat dissipation performance of the display device DD may be improved.

In an area that overlaps with the first and second heat dissipating parts RHL1 and RHL2, the (2_1)-th support plate PLT2_1 may include first protrusions PRT1 that protrude in the first direction DR1, and the (2_2)-th support plate PLT2_2 may include second protrusions PRT2 that protrude in the first direction DR1. The first protrusions PRT1 and the second protrusions PRT2 may protrude toward each other.

Accordingly, in the area that overlaps with the first and second heat dissipating parts RHL1 and RHL2, the (2_1)-th support plate PLT2_1 and the (2_2)-th support plate PLT2_2 may be disposed to be adjacent to each other to support the second step compensating layers SCL2 more easily. In an area that overlaps with the third heat dissipating part RHL3, a gap between the (2_1)-th support plate PLT2_1 and the (2_2)-th support plate PLT2_2 may be larger than a gap between the first protrusions PRT1 and the second protrusions PRT2.

The first bonding layer AU may be disposed between the first support plate PLT1 and the heat dissipating layer RHL. In more detail, the first bonding layer AL1 may be disposed between the cover layer COV and the heat dissipating layer RHL, and the cover layer COV may be disposed between the first support plate PLT1 and the first bonding layer AL1. A portion of the first bonding layer AL1, which overlaps with the folding area FA, may be opened (e.g., may have an opening or an opened portion A_OP). In other words, the first bonding layer AL1 may not be disposed under (e.g., underneath) the folding area FA.

The first bonding layer AL1 may include a (1_1)-th bonding layer AL1_1 that overlaps with the first non-folding area NFA1, and a (1_2)-th bonding layer AL1_2 that overlaps with the second non-folding area NFA2. The (1_2)-th bonding layer AL1_2 may be spaced apart from the (1_1)-th bonding layer AL1_1.

With respect to the first direction DR1, a second distance DT2 between the (1_1)-th bonding layer AL1_1 and the (1_2)-th bonding layer AL1_2 may be larger than the length LT. With respect to the first direction DR1, the second distance DT2 may be larger than the first width WT1.

The (1_1)-th bonding layer AL1_1 and the (1_2)-th bonding layer AL1_2 may not overlap with the folding area FA. An area between the (1_1)-th bonding layer AL1_1 and the (1_2)-th bonding layer AL1_2 may be defined as an opened portion of the first bonding layer AL1. The (1_1)-th bonding layer AL1_1 and the (1_2)-th bonding layer AL1_2 may have shapes that are the same or substantially the same as (or similar to) those of the first heat dissipating part RHL1 and the second heat dissipating part RHL2. Because the first bonding layer AL1 is not disposed under (e.g., underneath) the folding area FA, a folding operation of the support SUP may be performed more easily.

The second bonding layer AL2 may be disposed between the second support plate PLT2 and the heat dissipating layer RHL. A portion of the second bonding layer AL2, which overlaps with the folding area FA, may be opened (e.g., may have an opening). In other words, the second bonding layer AL2 may not be disposed under (e.g., underneath) the folding area FA.

The second bonding layer AL2 may include a (2_1)-th bonding layer AL2_1 that overlaps with the first non-folding area NFA1, and a (2_2)-th bonding layer AL2_2 that overlaps with the second non-folding area NFA2. The (2_2)-th bonding layer AL2_2 may be spaced apart from the (2_1)-th bonding layer AL2_1. With respect to the first direction DR1, the second distance DT2 between the (2_1)-th bonding layer AL2_1 and the (2_2)-th bonding layer AL2_2 may be larger than the width WT1.

The (2_1)-th bonding layer AL2_1 and the (2_2)-th bonding layer AL2_2 may not overlap with the folding area FA. An area between the (2_1)-th bonding layer AL2_1 and the (2_2)-th bonding layer AL2_2 may be defined as an opened portion of the second bonding layer AL2. The (2_1)-th bonding layer AL2_1 and the (2_2)-th bonding layer AL2_2 may have shapes that are the same or substantially the same as (or similar to) those of the first heat dissipating part RHL1 and the second heat dissipating part RHL2. Because the second bonding layer AL2 is not disposed under (e.g., underneath) the folding area FA, a folding operation of the support SUP may be performed more easily.

A space between the (1_1)-th bonding layer AL1_1 and the (1_2)-th bonding layer AL1_2 may be an opened portion A_OP of the first bonding layer AL1, which overlaps with the folding area FA. A space between the (2_1)-th bonding layer AL2_1 and the (2_2)-th bonding layer AL2_2 may be an opened portion A_OP of the second bonding layer AL2, which overlaps with the folding area FA. The second distance DT2 may be larger than the first and second widths WT1 and WT2. Accordingly, the first and second bonding layers AL1 and AL2 may be opened with a width that is larger than those of the third heat dissipating part RHL3 and the bending part BAP in the folding area FA.

The step compensating layer CP may be disposed between the cover layer COV and the second support plate PLT2. The step compensating layer CP may be disposed around an edge of the heat dissipating layer RHL, and around edges of the first and second bonding layers AL1 and AL2. The step compensating layer CP may include a double-sided tape.

The heat dissipating layer RHL and the first and second bonding layers AL1 and AL2 may not be disposed at portions that are adjacent to an edge of the cover layer COV and an edge of the second support plate PLT2. The step compensating layer CP may be adjacent to the cover layer COV and edges of the second support plate PLT2. The step compensating layer CP may surround (e.g., around peripheries of) the heat dissipating layer RHL and the first and second bonding layers AL1 and AL2.

The step compensating layer CP may be disposed between the cover layer COV and the second support plate PLT2 at a portion where the heat dissipating layer RHL and the first and second bonding layers AL1 and AL2 are not disposed. The step compensating layer CP may compensate for a step at the portion where the heat dissipating layer RHL and the first and second bonding layers AL1 and AL2 are not disposed.

Referring to FIGS. 4 to 7, the first step compensating layers SCL1 may overlap with the folding area FA, and the first bonding layer AL1 may be disposed in the opened area. In other words, the first step compensating layers SCL1 may be disposed between the (1_1)-th bonding layer AL1_1 and the (1_2)-th bonding layer AL1_2.

With respect to the third direction DR3, the first step compensating layers SCL1 may be disposed between the heat dissipating layer RHL and the first support plate PLT1. In more detail, the first step compensating layers SCL1 may be disposed between the heat dissipating layer RHL and the cover layer COV. The first step compensating layers SCL1 may compensate for a step at a portion where the first bonding layer AU is not disposed.

Referring to FIGS. 6 and 7, the first step compensating layers SCL1 may be attached to the heat dissipating layer RHL. The first step compensating layers SCL1 may be attached to the third heat dissipating part RHL3, and may not be attached to the cover layer COV. The first step compensating layers SCL1 may be single-sided tapes. For example, a bonding or adhesive layer is not disposed on an upper surface of the first step compensating layers SCL1, and a first adhesive layer ADL1 may be disposed on lower surfaces of the first step compensating layers SCL1. The first adhesive layer ADL1 may be disposed between the first step compensating layers SCL1 and the third heat dissipating part RHL3.

Referring to FIGS. 4, 6, and 7, the second step compensating layers SCL2 may overlap with the folding area FA, and may be disposed between the first heat dissipating part RNL1 and the second heat dissipating part RHL2. The second step compensating layers SCL2 may be disposed around the third heat dissipating part RHL3. The third heat dissipating part RHL3 may be disposed between the second step compensating layers SCL2. In an area in which the first protrusions PRT1 and the second protrusions PRT2 overlap with each other, the second step compensating layers SCL2 may have concave shapes.

The second step compensating layers SCL2 may be single-sided tapes. The second step compensating layers SCL2 may be attached to the second support plate PLT2, and may not be attached to the cover layer COV. For example, a bonding or adhesive layer is not disposed on an upper surface of the second step compensating layers SCL2, and a second adhesive layer ADL2 may be disposed on lower surfaces of the second step compensating layers SCL2. The second adhesive layer ADL2 may be disposed between the second step compensating layers SCL2 and the second support plate PLT2.

Although two first step compensating layers SCL1 and four second step compensating layers SCL2 are illustrated, the number of first step compensating layers SCL1 and the number of second step compensating layers SCL2 are not limited thereto.

Hereinafter, as used in the specification, a "thickness" represents a value measured in the third direction DR3, and a "thickness direction" may refer to the third direction DR3. In FIG. 5, a "width" may be defined as a value measured in a horizontal direction with respect the third direction DR3.

Referring to FIG. 5, a thickness of the first support plate PLT1 may be larger than a thickness of the second support plate PLT2, and the thickness of the second support plate PLT2 may be larger than thicknesses of the heat dissipating layer RHL and the step compensating layer CP. The thickness of the step compensating layer CP may be larger than the thickness of the heat dissipating layer RHL. The thickness of the heat dissipating layer RHL may be larger than the thickness of the cover layer COV. The thickness of the cover layer COV may be larger than thicknesses of the first and second bonding layers AL1 and AL2.

The width of the first support plate PLT1 may be larger than the width of the second support plate PLT2 and the width of the cover layer COV. Edges of the second support plate PLT2 and the cover layer COV may be disposed inside an edge of the first support plate PLT1. An edge of the step compensating layer CP may be disposed inside the edges of the second support plate PLT2 and the cover layer COV.

The width of the heat dissipating layer RHL and the widths of the first and second bonding layers AL1 and AL2 may be smaller than the width of the second support plate PLT2 and the width of the cover layer COV. The heat dissipating layer RHL and the first and second bonding layers AU and AL2 may be disposed inward from (e.g., inside) the step compensating layer CP.

The first and second bonding layers AL1 and AL2 may include a pressure sensitive adhesive (PSA), or an optically clear adhesive (OCA), but the kinds of the adhesives are not limited thereto.

Referring to FIG. 4, a first hole H1 and second holes H2 may be defined in each of the first support plate PLT1 and the second support plate PLT2. The first hole H1 and the second holes H2 may overlap with the first hole area HA1 and the second hole areas HA2. The first and second holes H1 and H2 may be defined in each of the cover layer COV and the step compensating layer CP. The second holes H2 may be integrally defined in each of the cover layer COV and the step compensating layer CP. The heat dissipating layer RHL, the first and second bonding layers AL1 and AL2, and the first and second step compensating layers SCL1 and SCL2 may not overlap with the first and second holes H1 and H2.

A first opening OP1 and a second opening OP2 may be defined in each of the cover layer COV and the second support plate PLT2. The first opening OP1 may be adjacent to the second opening OP2. The second opening OP2 may also be defined in the step compensating layer CP. The first opening OP1 may not be defined in the step compensating layer CP.

The first opening OP1 may also be defined in each of the heat dissipating layer RHL and the first and second bonding layers AL1 and AL2. Portions of the heat dissipating layer RHL and the first and second bonding layers AL1 and AL2, which overlap with the first opening OP1 of the second support plate PLT2, may be removed or substantially removed, such that the first openings OP1 may be defined in the heat dissipating layer RHL and the first and second bonding layers AL1 and AL2. For example, portions of corners of the heat dissipating layer RHL and the first and second bonding layers AU and AL2 may be removed or substantially removed, such that the first openings OP1 may be defined in the heat dissipating layer RHL and the first and second bonding layers AL1 and AL2.

Functions of the first and second holes H1 and H2 and functions of the first and second openings OP1 and OP2 will be described in more detail below.

Referring to FIGS. 4 and 5, the display module DM may be attached onto the support SUP. The display module DM may be attached to an upper surface of the first support plate PLT1. The first support plate PLT1 may support the display module DM. Heat generated in the display module DM may be emitted by the heat dissipating layer RHL, the first support plate PLT1, and the second support plate PLT2.

The (2_1)-th support plate PLT2_1 may support the first non-folding area NFA1. The (2_2)-th support plate PLT2_2 may support the second non-folding area NFA2. The (2_1)-th support plate PLT2_1 and the (2_2)-th support plate PLT2_2 may extend to the folding area FA to be disposed to be adjacent to each other in the folding area FA.

The (2_1)-th support plate PLT2_1 and the (2_2)-th support plate PLT2_2 may support the portions of the first support plate PLT1, at which the openings OP are defined, under (e.g., underneath) the folding area FA. When a pressure is applied to the first support plate PLT1 from an upper side, deformation of the portions of the first support plate PLT1 at which the openings OP are defined may be prevented or substantially prevented by the (2_1)-th support plate PLT2_1 and the (2_2)-th support plate PLT2_2.

The display module DM may include the display panel DP, a reflection preventing layer RPL, a window WIN, a window protecting layer WP, a hard coating layer HC, a panel protecting layer PPL, a barrier layer BRL, and third to eighth bonding layers AL3 to AL8. The reflection preventing layer RPL, the window WIN, the window protecting layer WP, and the hard coating layer HC may be disposed on the display panel DP. The panel protecting layer PPL and the barrier layer BRL may be disposed under (e.g., underneath) the display panel DP.

The reflection preventing layer RPL may be disposed on the display panel DP. The reflection preventing layer RPL may be defined as an external light reflection preventing film. The reflection preventing layer RPL may reduce a reflectivity of external light that is input toward (e.g., that is incident on) the display panel DP from the outside.

When the external light that travels toward the display panel DP is reflected by the display panel DP and is provided to a user toward the outside again, the user may view the external light like in a mirror. To prevent or substantially prevent this phenomenon, for example, the reflection preventing layer RPL may include a plurality of color filters that display the same or substantially the same color as that of the pixel.

The color filters may filter the external light with the same or substantially the same color as that of the pixel. In this case, the external light may not be viewed by the user. However, the present disclosure is not limited thereto, and in some embodiments, the reflection preventing layer RPL may include a retarder and/or a polarizer to reduce a reflectivity of the external light.

The window WIN may be disposed on the reflection preventing layer RPL. The window WIN may protect the display panel DP and the reflection preventing layer RPL from an external scratch. The window WIN may have an optically transparent property. For example, the window WIN may include glass. However, the present disclosure is not limited thereto, and the window WIN may include a synthetic resin film.

The window WIN may have a multilayered structure or a mono-layered structure. For example, the window WIN may include a plurality of synthetic resin films connected to (e.g., coupled to or attached to) each other by an adhesive, or may include a glass substrate and a synthetic resin film connected to (e.g., coupled to or attached to) each other by an adhesive.

The window protecting layer WP may be disposed on the window WIN. The window protecting layer WP may include a flexible plastic material, for example, such as polyimide or polyethylene terephthalate. The hard coating layer HC may be disposed on an upper surface of the window protecting layer WP.

A printing layer PIT may be disposed on a lower surface of the window protecting layer WP. The printing layer PIT may have a black color, but the color of the printing layer PIT is not limited thereto. The printing layer PIT may be adjacent to an edge of the window protecting layer WP.

The third bonding layer AL3 may be disposed between the window protecting layer WP and the window WIN. In other words, the window protecting layer WP and the window WIN may be combined with each other by the third bonding layer AL3. The third bonding layer AL3 may cover the printing layer PIT.

The fourth bonding layer AL4 may be disposed between the window WIN and the reflection preventing layer RPL. In other words, the window WIN and the reflection preventing layer RPL may be combined with each other by the fourth bonding layer AL4.

The fifth bonding layer AL5 may be disposed between the reflection preventing layer RPL and the display panel DP. In other words, the reflection preventing layer RPL and the display panel DP may be combined with each other by the fifth bonding layer AL5.

The panel protecting layer PPL may be disposed under (e.g., underneath) the display panel DP. The panel protecting layer PPL may protect a lower portion of the display panel DP. The panel protecting layer PPL may include a flexible plastic material. For example, the panel protecting layer PPL may include polyethylene terephthalate (PET).

The barrier layer BRL may be disposed under (e.g., underneath) the panel protecting layer PPL. The barrier layer BRL may increase a resistant force to a compression force due to external pressing. Accordingly, the barrier layer BRL may function to prevent or substantially prevent deformation of the display panel DP. The barrier layer BRL may include a flexible plastic material, for example, such as polyimide or polyethylene terephthalate.

The barrier layer BRL may have a suitable color that absorbs light. For example, the barrier layer BRL may have a black color. In this case, when the display module DM is viewed from a top of the display module DM (e.g., in a plan view), constituent elements disposed under (e.g., underneath) the barrier layer BRL may not be viewed.

The sixth bonding layer AL6 may be disposed between the display panel DP and the panel protecting layer PPL. The display panel DP and the panel protecting layer PPL may be combined with each other by the sixth bonding layer AL6.

The seventh bonding layer AL7 may be disposed between the panel protecting layer PPL and the barrier layer BRL. The panel protecting layer PPL and the barrier layer BRL may be combined with each other by the seventh bonding layer AL7.

The eighth bonding layer AL8 may be disposed between the barrier layer BRL and the first support plate PLT1. The barrier layer BRL and the first support plate PLT1 may be combined with each other by the eighth bonding layer AL8. The eighth bonding layer AL8 may not overlap with the folding area FA. In other words, the eighth bonding layer AL8 may not be disposed at (e.g., in or on) the folding area FA.

The third to eighth bonding layers AL3 to AL8 may include a pressure sensitive adhesive (PSA), or a transparent adhesive, for example, such as an optically clear adhesive (OCA), but the kinds of the adhesives are not limited thereto.

A thickness of the panel protecting layer PPL may be smaller than a thickness of the window protecting layer WP. A thickness of the reflection preventing layer RPL may be smaller than the thickness of the panel protecting layer PPL. A thickness of the display panel DP may be smaller than the thickness of the reflection preventing layer RPL. A thickness of the window WIN may be the same or substantially the same as the thickness of the reflection preventing layer RPL. A thickness of the barrier layer BRL may be smaller than a thickness of the panel protecting layer PPL and larger than the thickness of the reflection preventing layer RPL.

A thickness of the third bonding layer AL3 may be the same or substantially the same as the thickness of the barrier layer BRL, and thicknesses of the fourth bonding layer AL4 and the fifth bonding layer AL5 may be the same or substantially the same as the thickness of the panel protecting layer PPL. Thicknesses of the sixth bonding layer AL6 and the seventh bonding layer AL7 may be smaller than the thickness of the display panel DP. The sixth bonding layer AL6 and the seventh bonding layer AL7 may have the same or substantially the same thickness as each other.

A thickness of the eighth bonding layer AL8 may be smaller than the thicknesses of the sixth bonding layer AL6 and the seventh bonding layer AL7, and a thickness of the hard coating layer HC may be smaller than the thickness of the eighth bonding layer AL8. The thicknesses of the first and second bonding layers AL1 and AL2 may be smaller than the thickness of the hard coating layer HC.

A width of the first support plate PLT1 may be larger than the width of the display module DM. An edge of the display module DM may be disposed inside an edge of the first support plate PLT1.

The display panel DP, the reflection preventing layer RPL, the panel protecting layer PPL, and the fifth and sixth bonding layers AL5 and AL6 may have the same or substantially the same width as each other. The window protecting layer WP and the third bonding layer AL3 may have the same or substantially the same width as each other.

The widths of the display panel DP, the reflection preventing layer RPL, the panel protecting layer PPL, and the fifth and sixth bonding layers AL5 and AL6 may be larger than the widths of the window protecting layer WP and the third bonding layer AL3. The edges of the display panel DP, the reflection preventing layer RPL, the panel protecting layer PPL, and the fifth and sixth bonding layers AL5 and AL6 may be disposed at (e.g., in or on) an outside of the edges of the window protecting layer WP and the third bonding layer AL3.

The widths of the window WIN and the fourth bonding layer AL4 may be smaller than the widths of the window protecting layer WP and the third bonding layer AL3. The width of the fourth bonding layer AL4 may be smaller than the width of the window WIN. The edge of the window WIN may be disposed inside the edges of the window protecting layer WP and the third bonding layer AL3. The edge of the fourth bonding layer AL4 may be disposed inside the edge of the window WIN.

The barrier layer BRL and the seventh and eighth bonding layers AL7 and AL8 may have the same or substantially the same width as each other. The edges of the barrier layer BRL and the seventh and eighth bonding layers AL7 and AL8 may be disposed inside the edges of the display panel DP, the reflection preventing layer RPL, the panel protecting layer PPL, and the fifth and sixth bonding layers AL5 and AL6.

Figure 8:
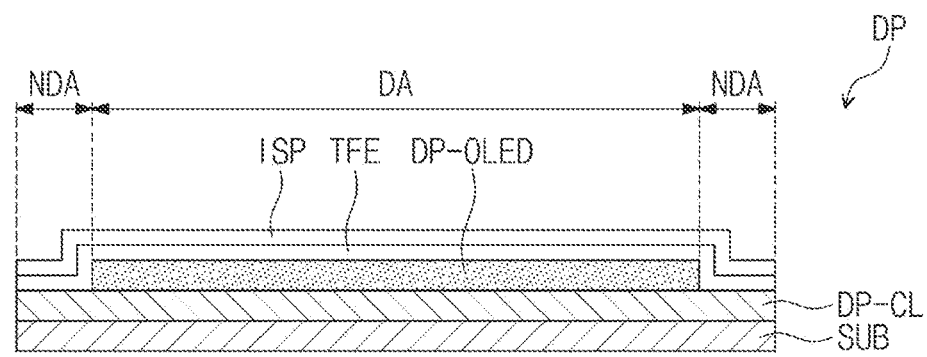
FIG. 8 is a cross-sectional view illustrating an example of a display panel illustrated in FIG. 5.

FIG. 8 is a cross-sectional view illustrating an example of a display panel illustrated in FIG. 5.

Referring to FIG. 8, the display panel DP may include a substrate SUB, a circuit element layer DP-CL disposed on the substrate SUB, a display element layer DP-OLED disposed on the circuit element layer DP-CL, a thin film encapsulation layer TFE disposed on the display element layer DP-OLED, and an input sensing part ISP disposed on the thin film encapsulation layer TFE. The display element layer DP-OLED may be disposed at (e.g., in or on) the display area DA.

The substrate SUB may include the display area DA, and the non-display area NDA around (e.g., adjacent to) the display area DA. The substrate SUB may include a flexible plastic material. For example, the substrate SUB may include polyimide (PI).

The circuit element layer DP-CL may include an insulation layer, a semiconductor pattern, a conductive pattern, and a signal line. Through a suitable method, for example, such as coating and deposition, the insulation layer, the semiconductor layer, and the conductive layer may be formed on the substrate SUB. Thereafter, a semiconductor pattern, a conductive pattern, and a signal line may be formed by selectively patterning the insulation layer, the semiconductor layer, and the conductive layer through a plurality of photolithography processes.

The circuit element layer DP-CL may include a plurality of transistors formed of the semiconductor pattern, the conductive pattern, and the signal line. The display element layer DP-OLED may include light emitting elements connected to the transistors. The pixels PX illustrated in FIG. 3 may include the transistors and the light emitting elements.

The thin film encapsulation layer TFE may be disposed on the circuit element layer DP-CL to cover the display element layer DP-OLED. The thin film encapsulation layer TFE may include an inorganic layer, an organic layer, and an inorganic layer, which may be laminated sequentially. The inorganic layers include an inorganic material, and may protect the pixels PX from moisture and/or oxygen. The organic layer includes an organic material, and may protect the pixels PX from foreign substances, for example, such as dust particles.

The input sensing part ISP may include a plurality of sensors for detecting an external input. The sensors may detect the external input in a capacitive scheme. The external input may include various suitable forms of inputs, for example, such as a portion of a user's body, a pen, light, heat, and/or pressure.

The input sensing part ISP may be manufactured (e.g., may be formed or disposed) directly on the thin film encapsulation layer TFE when the display panel DP is manufactured. However, the present disclosure is not limited thereto, and in some embodiments, the input sensing part ISP may be manufactured as a separate panel from the display panel DP, and may be attached to the display panel DP by a bonding layer.

Figure 9:
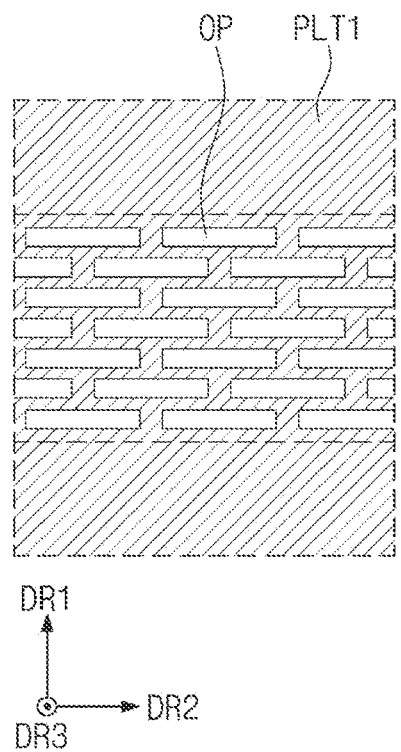
FIG. 9 is a plan view of a portion of a first support plate in which openings illustrated in FIGS. 4 and 5 are defined.

FIG. 9 is a plan view of a portion of a first support plate in which openings illustrated in FIGS. 4 and 5 are defined.

Referring to FIGS. 4, 5, and 9, the openings OP defined in the first support plate PLT1 may be arranged according to a suitable rule (e.g., a predetermined or specific rule). For example, the openings OP may be arranged in a grid form. With respect to a column corresponding to the second direction DR2, openings OP disposed in an h-th row and openings OP disposed in a (h+1)-th row may be disposed alternately with each other, where h is a natural number.

The openings OP are defined at the portions of the first support plate PLT1, which overlap with the folding area FA, and thus, the first support plate PLT1 may be easily folded in an area that overlaps with the folding area FA.

Figure 10:
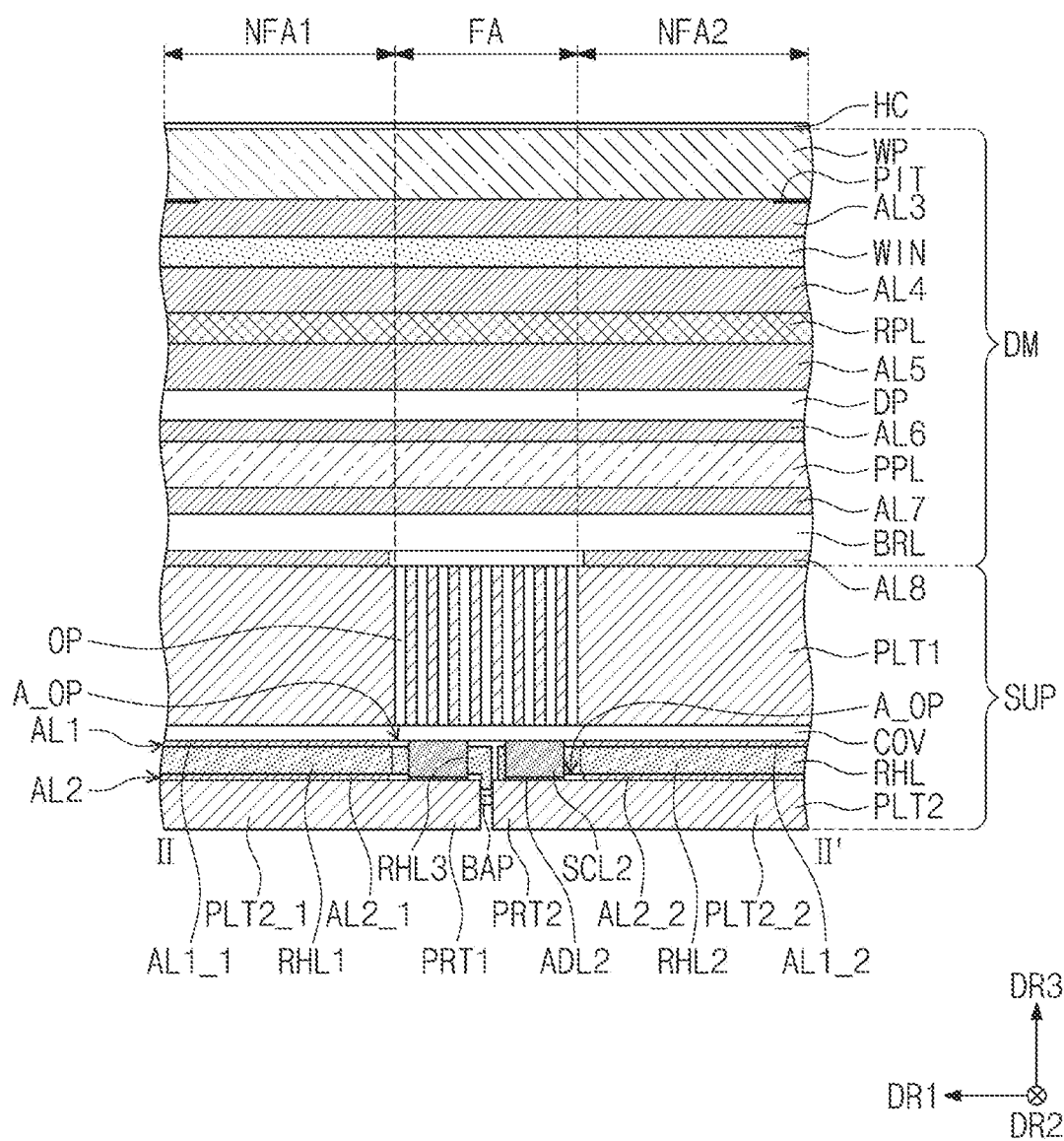
FIG. 10 is a cross-sectional view taken along the line II-II' of FIG. 4.

FIG. 10 is a cross-sectional view taken along the line II-II' of FIG. 4.

Referring to FIGS. 4, 6, and 10, the second step compensating layers SCL2 may overlap with the folding area FA, and may be disposed between the cover layer COV and the second support plate PLT2. As described above, the second step compensating layers SCL2 may be attached to the second support plate PLT2, and may not be attached to the cover layer COV.

The second step compensating layers SCL2 may be disposed in the opened portion A_OP of the first and second bonding layers AL1 and AL2. The second step compensating layers SCL2 may be disposed between the first heat dissipating part RHL1 and the second heat dissipating part RHL2, between the (1_1)-th bonding layer AL1_1 and the (1_2)-th bonding layer AL1_2, and between the (2_1)-th bonding layer AL2_1 and the (2_2)-th bonding layer AL2_2.

The second step compensating layers SCL2 may be disposed between the first heat dissipating part RHL1 and the second heat dissipating part RHL2, in which the third heat dissipating part RHL3 and the first and second bonding layers AU and AL2 are not disposed. The second step compensating layers SCL2 may compensate for a step at the portion at which the third heat dissipating part RHL3 and the first and second bonding layers AL1 and AL2 are not disposed.

Referring to FIGS. 5, 7, and 10, thicknesses of the second step compensating layers SCL2 with respect to the third direction DR3 may be larger than the thickness of the first step compensating layers SCL1. Because the first and second step compensating layers SCL1 and SCL2 are disposed at the portions at which the first and second bonding layers AL1 and AL2 and the third heat dissipating part RHL3 are not disposed, the structure of the support SUP may be implemented more firmly. The first and second protrusions PRT1 and PRT2 may support the second step compensating layers SCL2.

Figure 11:
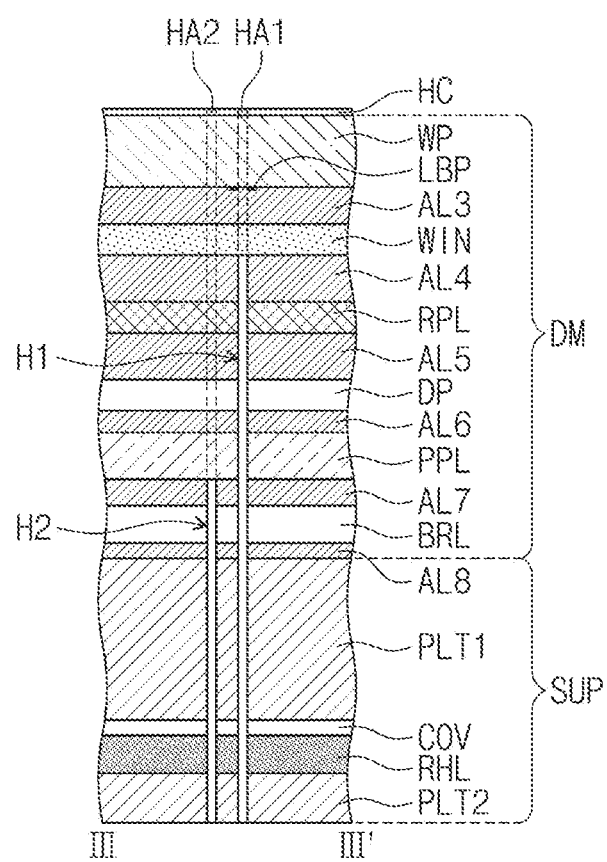
FIG. 11 is a cross-sectional view taken along the line III-III' of FIG. 4.

FIG. 11 is a cross-sectional view taken along the line III-III' of FIG. 4.

Referring to FIGS. 4 and 11, the first hole H1 and the second holes H2 that overlap with the first and second hole areas HA1 and HA2 may be defined in the support SUP and the display module DM. A light shielding pattern LBP may be disposed around (e.g., adjacent to) the first hole area HA1. The light shielding pattern LBP may be disposed at (e.g., in or on) the same layer as that of the printing layer PIT. The light shielding pattern LBP may be disposed on a lower surface of the window protecting layer WP.

The first hole H1 may be formed in the second support plate PLT2 to the fourth bonding layer AL4. For example, the first hole H1 may be formed in the second support plate PLT2, the step compensating layer CP, the cover layer COV, the first support plate PLT1, the barrier layer BRL, the panel protecting layer PPL, the display panel DP, the reflection preventing layer RPL, and the fourth to eighth bonding layers AL4 to AL8.

The second hole H2 may be formed in the second support plate PLT2 to the seventh bonding layer AL7. For example, the second hole H2 may be formed in the second support plate PLT2, the step compensating layer CP, the cover layer COV, the first support plate PLT1, the barrier layer BRL, and the seventh and eighth bonding layers AL7 and AL8.

The above-described camera CM may be disposed in the first hole H1. The above-described sensor SN may be disposed in the second hole H2. Through the first and second holes H1 and H2, a light signal may be provided to the camera CM and the sensor SN.

Figure 12:
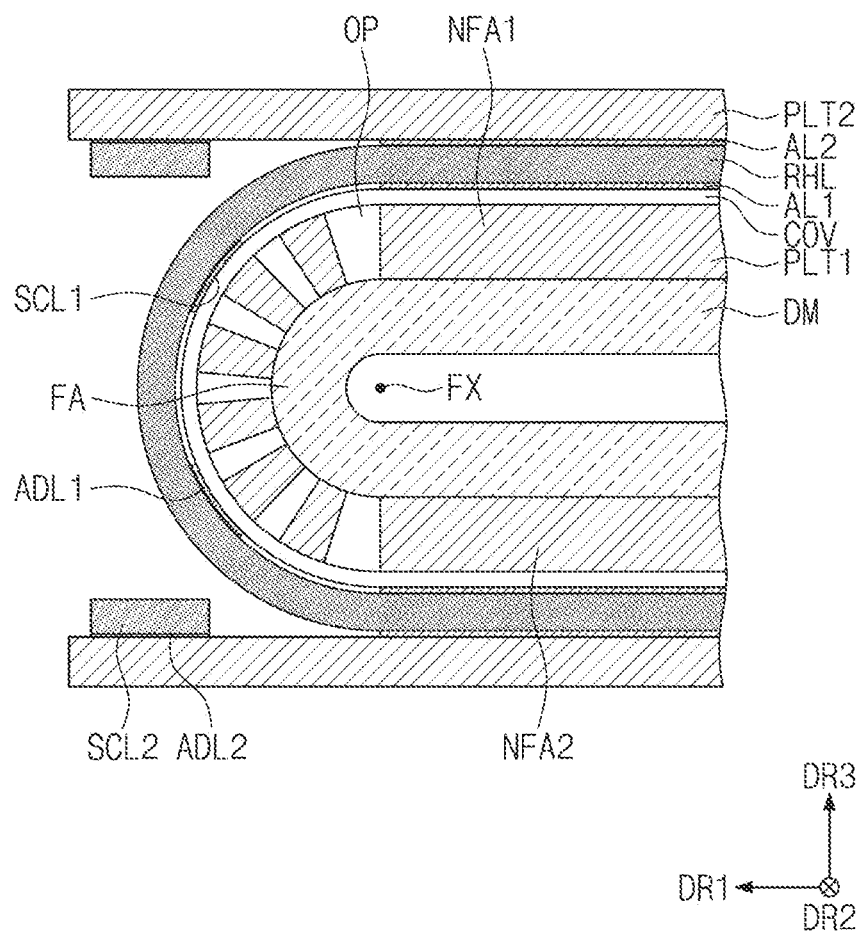
FIG. 12 is a view illustrating an in-folding state of the display device illustrated in FIG. 5.

FIG. 12 is a view illustrating an in-folding state of the display device illustrated in FIG. 5.

For convenience of illustration, FIG. 12 illustrates the display module DM as a mono-layer instead of the detailed configurations of the display module DM.

Referring to FIG. 12, the display device DD may be in-folded with respect to the folding axis FX. The folding area FA may be bent, such that the first non-folding area NFA1 and the second non-folding area NFA2 face each other. The first non-folding area NFA1 that overlaps with the (2_1)-th support plate PLT2_1 and the second non-folding area NFA2 that overlaps with the (2_2)-th support plate PLT2_2 may maintain a flat or substantially flat state.

The display device DD may be changed from a first state (e.g., a flat first state) as illustrated FIG. 5 to a second state (e.g., a folded second state) as illustrated in FIG. 12, or may be changed from the second state to the first state. The folding operation may be performed repeatedly.

Because the display module DM is a flexible display module, the folding area FA of the display module DM may be easily bent. The plurality of openings OP that overlap with the folding area FA may be defined in the first support plate PLT1. Accordingly, during a folding operation, a portion of the first support plate PLT1 that overlaps with the folding area FA may be easily bent due to the openings OP.

Because the second step compensating layers SCL2 are attached to the second support plate PLT2 but are not attached to the cover layer COV, the second step compensating layers SCL2 may move along with the second support plate PLT2 when the display device DD is folded.

Because the second support plate PLT2 maintains or substantially maintains a flat state and the cover layer COV may be bent to be curved, when the second support plate PLT2 and the cover layer COV are moved to be farther away from each other during the folding operation, in the case in which the second step compensating layers SCL2 are attached to the cover layer COV, the second step compensating layers SCL2 may be damaged. Furthermore, during the folding operation, because the second support plate PLT2 and the cover layer COV may be moved to be farther away from each other, the second step compensating layers SCL2 may be delaminated from the second support plate PLT2 or the cover layer COV. Accordingly, in an embodiment of the present disclosure, the second step compensating layers SCL2 may be attached to the second support plate PLT2 and may not be attached to the cover layer COV.

Referring to FIGS. 5 and 12, when the display module DM and the support SUP are folded, the bending part BAP of the heat dissipating layer RHL may be unfolded to have a curved shape having a suitable curvature (e.g., a predetermined or specific curvature). Unless the bending part BAP is formed in the heat dissipating layer RHL, the heat dissipating layer RHL may be damaged due to a high tensile force that may be generated at a portion of the heat dissipating layer RHL, which overlaps with the folding area FA, when the folding area FA is folded.

However, according to an embodiment of the present disclosure, the bending part BAP of the heat dissipating layer RHL may be bent in advance when the display module DM and the support SUP are in the unfolded state, and the bent bending part BAP may be unfolded to have a curved shape when the display module DM and the support SUP are folded. Accordingly, when the folding area FA is folded, a tensile force generated at the portion of the heat dissipating layer RHL that overlaps with the folding area FA may be reduced, and thus, damage to the heat dissipating layer RHL may be prevented or substantially prevented.

When the heat dissipating layer RHL is disposed under (e.g., underneath) the second support plate PLT2 to be disposed at (e.g., in or on) an outer side, the portion of the heat dissipating layer RHL that overlaps with the folding area FA may be bent to have a large radius of curvature during the folding operation. As the radius of curvature increases, the tensile force generated in the heat dissipating layer RHL may increase.

According to an embodiment of the present disclosure, the heat dissipating layer RHL may be disposed between the first support plate PLT1 and the second support plate PLT2. Accordingly, during the folding operation, the portion of the heat dissipating layer RHL that overlaps with the folding area FA may be bent to have a smaller radius of curvature. As a result, the tensile force generated in the heat dissipating layer RHL may be decreased.

Figure 13:
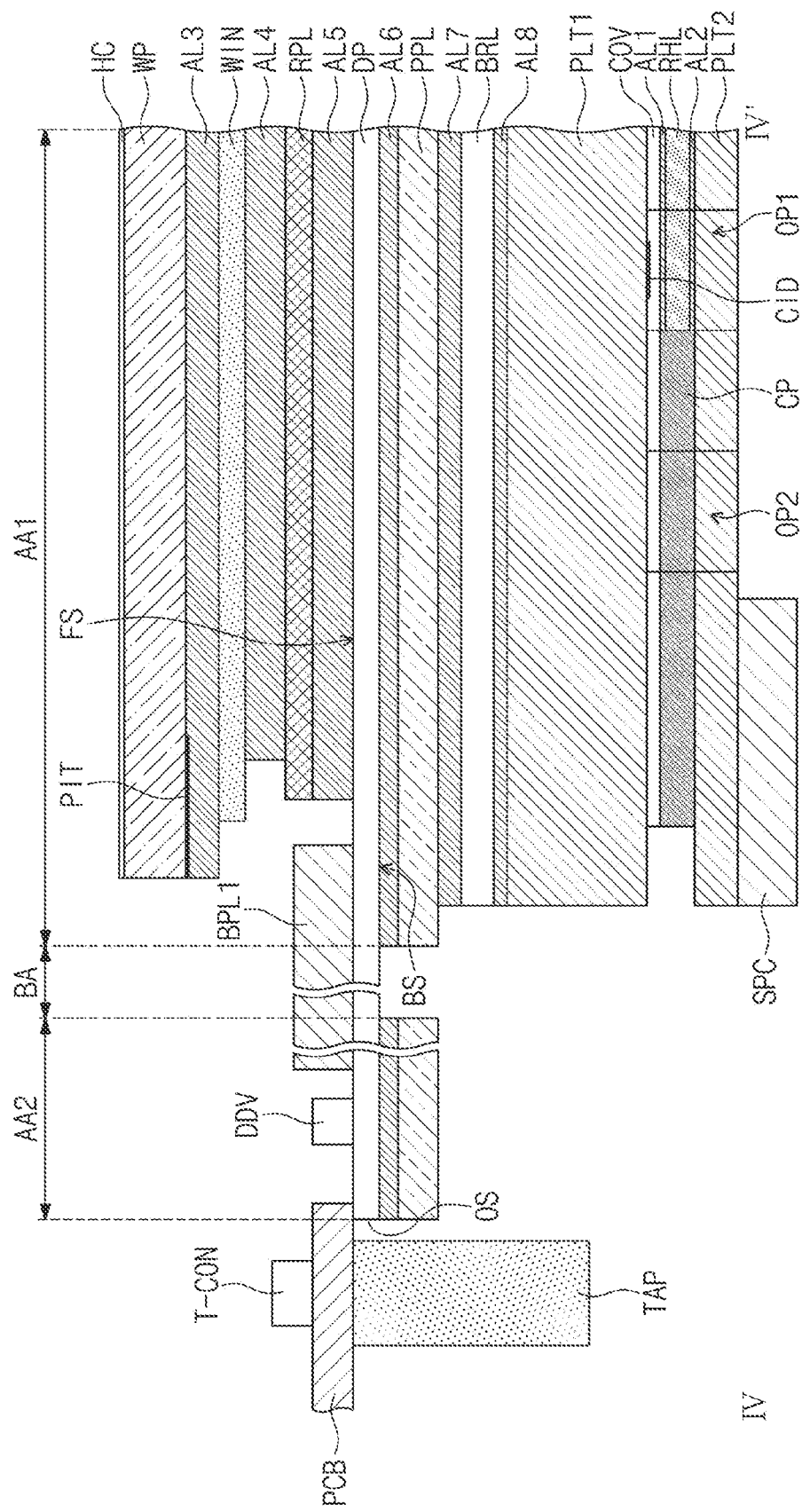
FIG. 13 is a cross-sectional view taken along the line IV-IV' of FIG. 4.
Figure 14:
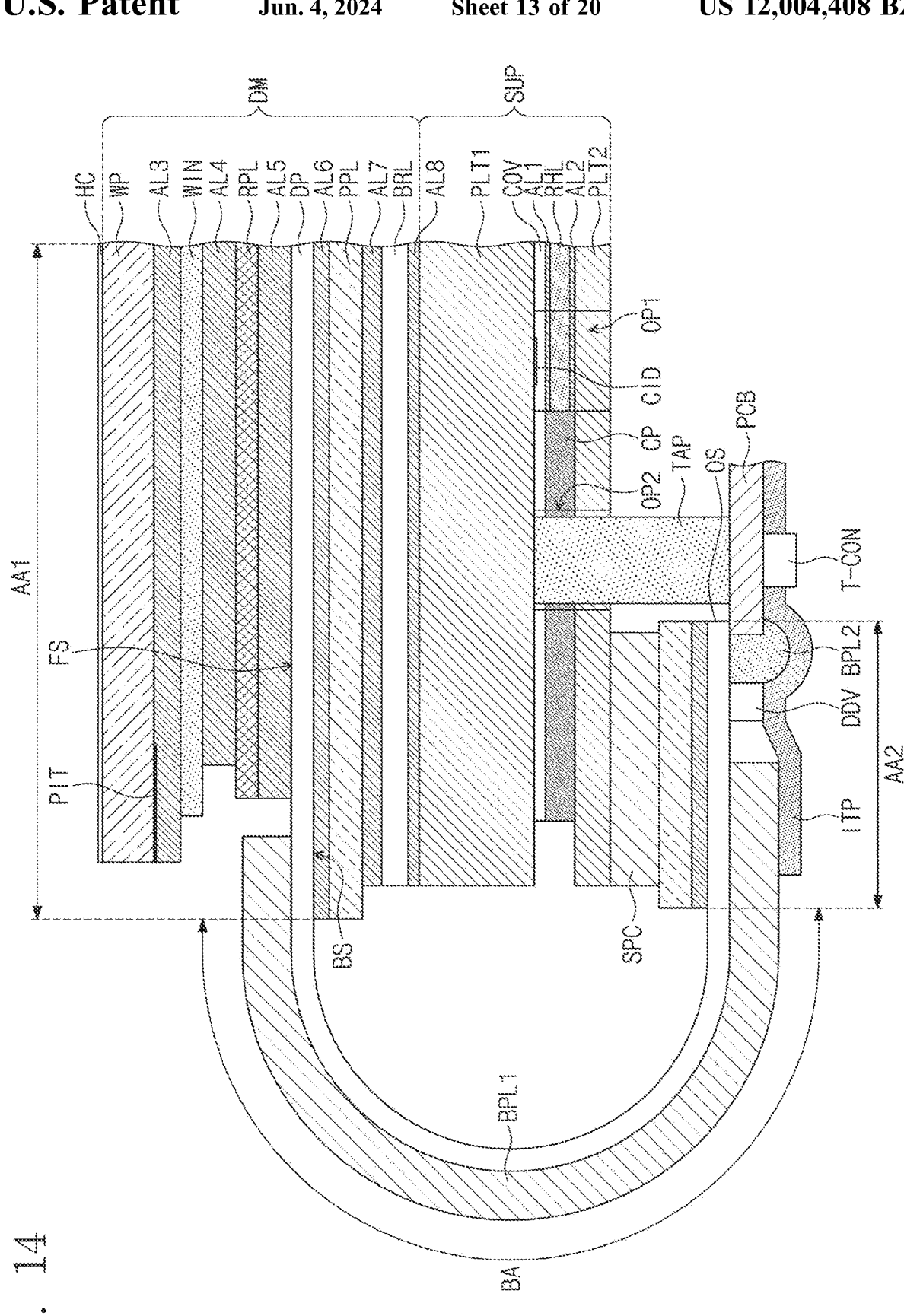
FIG. 14 is a view illustrating a state in which a bending area illustrated in FIG. 13 is bent.

FIG. 13 is a cross-sectional view taken along the line IV-IV' of FIG. 4. FIG. 14 is a view illustrating a state in which a bending area illustrated in FIG. 13 is bent.

The first area AA1, the bending area BA, and the second area AA2, which are indicated by dotted line borders in FIGS. 13 and 14, may indicate areas of the display panel DP.

Referring to FIGS. 4 and 13, sides of the barrier layer BRL, and the seventh and eighth bonding layers AL7 and AL8 may overlap with one side of the first support plate PLT1. One side of the first support plate PLT1 may overlap with one side of the second support plate PLT2.

Sides of the cover layer COV and the step compensating layer CP may overlap with each other. Sides of the cover layer COV and the step compensating layer CP may be disposed on an inner side of one side of the first support plate PLT1. The barrier layer BRL, the first and second support plates PLT1 and PLT2, and the cover layer COV may be disposed under (e.g., underneath) the first area AA1.

The display device DD may further include a spacer SPC. The spacer SPC may be disposed under (e.g., underneath) the second support plate PLT2. The spacer SPC may be a double-sided tape. For example, the spacer SPC may include a base layer such as polyethylene terephthalate having a flexibility, and an adhesive disposed on an upper surface and a lower surface of the base layer. One side of the spacer SPC may overlap with one side of the second support plate PLT2.

Sides of the display panel DP, the panel protecting layer PPL, and the sixth bonding layer AL6 may be disposed at (e.g., in or on) an outside of one side of the first support plate PLT1. The panel protecting layer PPL and the sixth bonding layer AL6 may not be disposed under (e.g., underneath) the bending area BA. The data driver DDV may be disposed at (e.g., in or on) the second area AA2 of the display panel DP.

Sides of the reflection preventing layer RPL and the fifth bonding layer AL5 may overlap with each other. Sides of the reflection preventing layer RPL and the fifth bonding layer AL5 may be disposed at (e.g., in or on) an inner side of sides of the cover layer COV and the step compensating layer CP. One side of the fourth bonding layer AL4 may be disposed at (e.g., in or on) an inner side of sides of the reflection preventing layer RPL and the fifth bonding layer AL5.

One side of the window WIN may be disposed at (e.g., in or on) an outside of one side of the reflection preventing layer RPL, and may be disposed at (e.g., in or on) an inside of one side of the cover layer COV. Sides of the window protecting layer WP and the third bonding layer AL3 may be disposed at (e.g., in or on) an inside of one side of the first support plate PLT1 and may be disposed at (e.g., in or on) an outside of one side of the cover layer COV.

The display panel DP may include a front surface FS that faces the window WIN, and a rear surface BS that faces the first support plate PLT1. The front surface FS and the rear surface BS may be configurations of the first area AA1.

The printed circuit board PCB may be connected to the display panel DP. For example, the printed circuit board PCB may be connected to the one side OS of the second area AA2. A timing controller T-CON may be disposed on the printed circuit board PCB. The timing controller T-CON may be formed of an integrated circuit chip, and may be mounted on an upper surface of the printed circuit board PCB.

A tape TAP may be disposed under (e.g., underneath) the printed circuit board PCB. The tape TAP may include a double-sided tape. The tape TAP may be disposed on a lower surface of the printed circuit board PCB, and may be attached to the lower surface of the printed circuit board PCB.

A cell ID layer CID may be disposed on a lower surface of the first support plate PLT1. The cell ID layer CID may be defined as a product unique number. The first opening OP1 may be defined in each of the second support plate PLT2, the heat dissipating layer RHL, the cover layer COV, the first bonding layer AL1, and the second bonding layer AL2. The cell ID layer CID may be exposed to the outside due to the first opening OP1. An operator may identify a unique number of the product through the first opening OP1 during a process.

The display device DD may further include a first protection layer BPL1. The first protection layer BPL1 may be disposed at (e.g., in or on) the bending area BA, a portion of the first area AA1 that is adjacent to the bending area BA, and a portion of the second area AA2 that is adjacent to the bending area BA. The first protection layer BPL1 may continuously extend from a portion of the first area AA1 that is adjacent to the bending area BA, through the bending area BA, and to the second area AA2 that is adjacent to the bending area BA.

The first protection layer BPL1 may be spaced apart from the reflection preventing layer RPL, and may be disposed between the window protecting layer WP and the display panel DP at the first area AA1. The first protection layer BPL1 may be spaced apart from the data driver DDV at (e.g., in or on) the second area AA2. One side of the first protection layer BPL1 that faces the reflection preventing layer RPL, when viewed on the plane (e.g., in a plan view), may be disposed between one side of the window WIN and one side of the window protecting layer WP. The first protection layer BPL1 may include an acryl resin or a urethane resin.

The first protection layer BPL1 may function to protect the bending area BA. The first protection layer BPL1 may cover wiring lines disposed at (e.g., in or on) the bending area BA to protect the wiring lines disposed at (e.g., in or on) the bending area BA. The first protection layer BPL1 may prevent or substantially prevent a crack from forming in the bending area BA when the bending area BA is bent by supplementing a strength of the bending area BA. The first protection layer BPL1 may protect the bending area BA from an external impact.

The display device DD may further include a second protection layer BPL2. The second protection layer BPL2 may be disposed on the printed circuit board PCB and the second area AA2 to cover a joining part (e.g., the above-described bonding part BDP) of the printed circuit board PCB and the second area AA2. The second protection layer BPL2 may be disposed from a portion of the printed circuit board PCB that is adjacent to the one side OS of the second area AA2 to one side of the data driver DDV that is adjacent to the one side OS of the second area AA2.

Referring to FIG. 14, the bending area BA may be bent and the second area AA2 may be disposed under (e.g., underneath) the first area AA1. The first protection layer BPL1 may be bent together with the bending area BA. Sides of the configurations illustrated in FIG. 13 may be defined as sides that are adjacent to the bent bending area BA in FIG. 14. With reference to the structure illustrated in FIG. 14, the spacer SPC may be disposed between the first area AA1 and the second area AA2. The data driver DDV may be disposed under (e.g., underneath) the second area AA2.

The data driver DDV, the printed circuit board PCB, and the timing controller T-CON may be disposed under (e.g., underneath) the second support plate PLT2. The tape TAP may be disposed on one surface of the printed circuit board PCB, which faces a lower surface of the first support plate PLT1.

A portion of the panel protecting layer PPL disposed at (e.g., in or on) the second area AA2 may be disposed under (e.g., underneath) the spacer SPC, and may be attached to the spacer SPC that is a double-sided tape. The second area AA2 may be attached to the spacer SPC through the panel protecting layer PPL. A gap between the second support plate PLT2 and the portion of the panel protecting layer PPL disposed at (e.g., in or on) the second area AA2 may be formed by the spacer SPC.

Unless the spacer SPC is disposed, the portion of the panel protecting layer PPL disposed at (e.g., in or on) the second area AA2 may be disposed adjacent to the second support plate PLT2, and may be attached to the second support plate PLT2. In this case, a curvature of the bending area BA may be increased, and a stress of the bending area BA may be increased.

Because the spacer SPC is disposed, the gap between the second support plate PLT2 and the portion of the panel protecting layer PPL disposed at (e.g., in or on) the second area AA2 may be formed, and the curvature of the bending area BA may be decreased. Accordingly, the stress of the bending area BA may be decreased. Because the spacer SPC is used, the bending area BA may have a desired curvature (e.g., a predetermined or preset curvature).

The display device DD may further include an insulation tape ITP that is disposed under (e.g., underneath) the second area AA2 to cover the data driver DDV. The insulation tape ITP may be disposed under (e.g., underneath) a portion of the first protection layer BPL1 disposed under (e.g., underneath) the second area AA2.

The insulation tape ITP may be disposed under (e.g., underneath) the second protection layer BPL2 to cover the second protection layer BPL2. The insulation tape ITP may be disposed under (e.g., underneath) the printed circuit board PCB. The insulation tape ITP may not be disposed under (e.g., underneath) the timing controller T-CON and may not cover the timing controller T-CON.

The second opening OP2 may be defined in the second support plate PLT2, the step compensating layer CP, and the cover layer COV. The tape TAP may be disposed in the second opening OP2. The tape TAP may be attached to the first support plate PLT1. The tape TAP may be attached to the first support plate PLT1, and thus, the printed circuit board PCB and the timing controller T-CON may be fixed to the support SUP.

Figure 15:
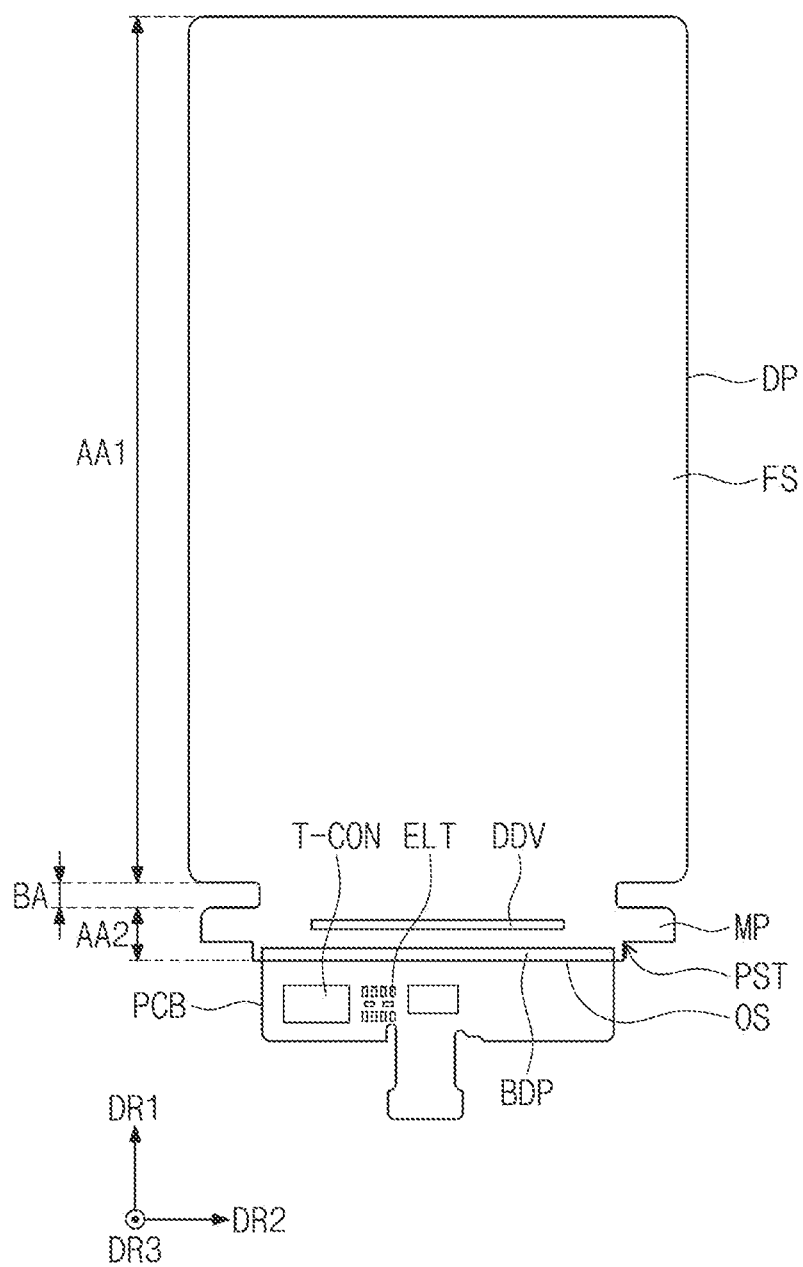
FIG. 15 is a plan view of a display panel and a printed circuit board illustrated in FIG. 13.
Figure 16:
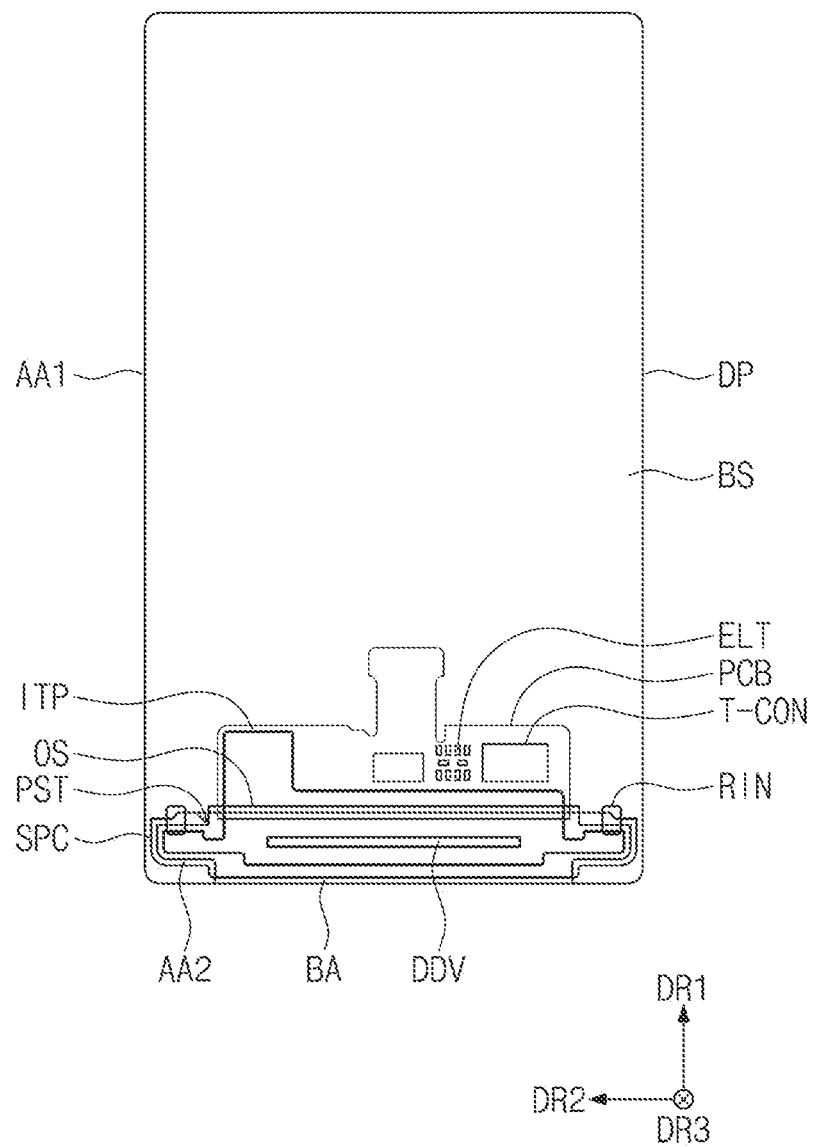
FIG. 16 is a plan view of the display panel, a spacer, and the printed circuit board illustrated in FIG. 14.
Figure 17:
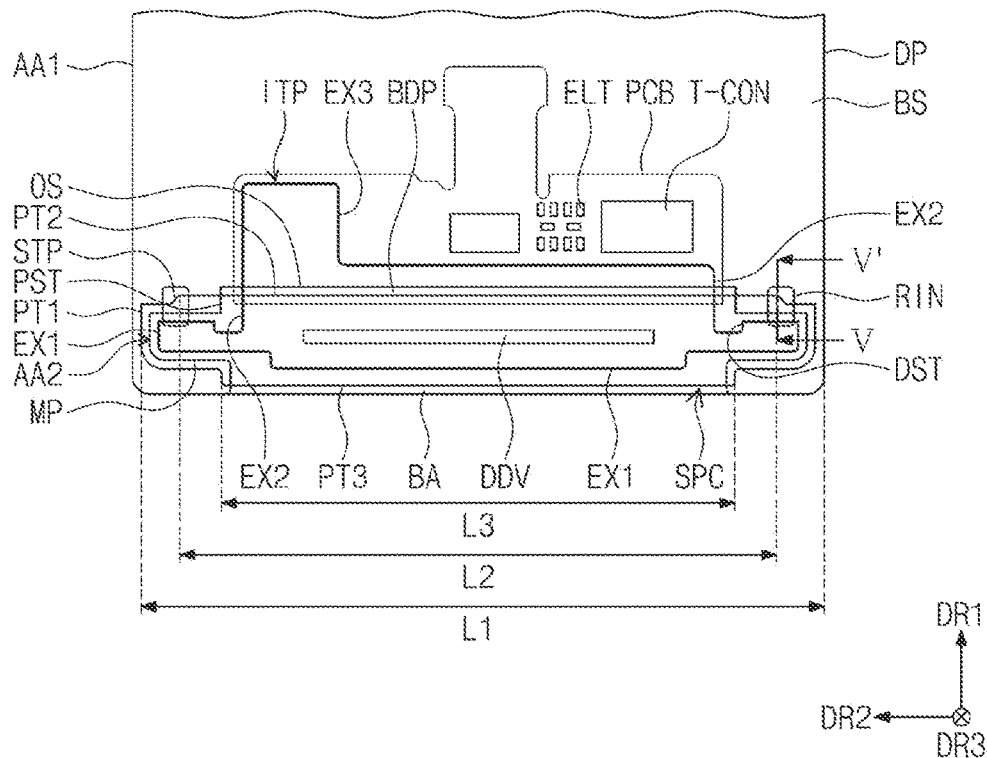
FIG. 17 is an enlarged view of the spacer and an insulation tape illustrated in FIG. 16.
Figure 18:
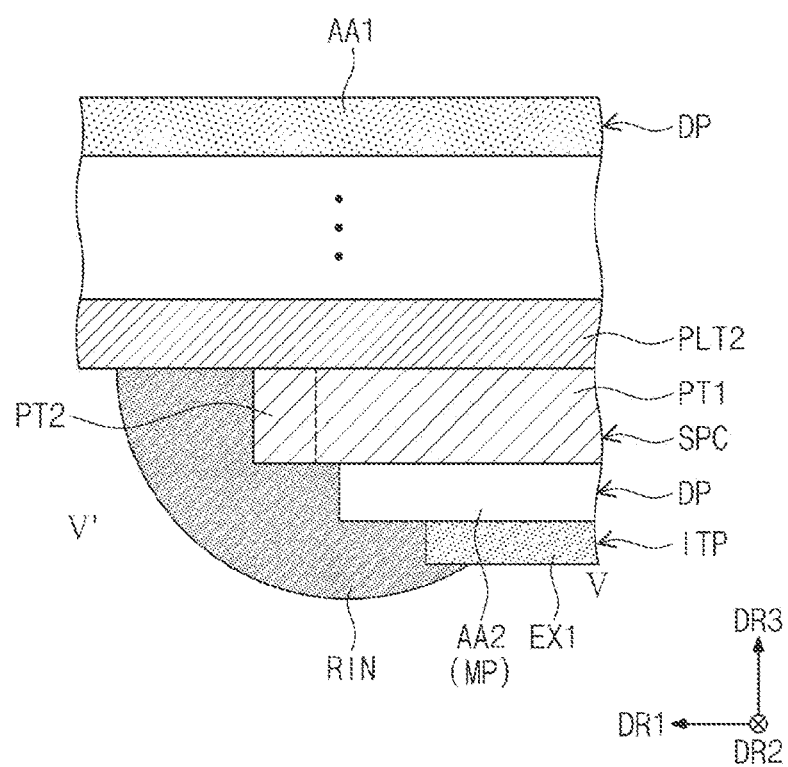
FIG. 18 is a cross-sectional view taken along the line V-V' of FIG. 17.

FIG. 15 is a plan view of a display panel and a printed circuit board illustrated in FIG. 13. FIG. 16 is a plan view of the display panel, a spacer, and the printed circuit board illustrated in FIG. 14. FIG. 17 is an enlarged view of the spacer and an insulation tape illustrated in FIG. 16. FIG. 18 is a cross-sectional view taken along the line V-V' of FIG. 17.

FIG. 15 is a plan view corresponding to the front surface FS of the display panel DP before being bent at the bending area BA. FIG. 16 is a plan view corresponding to the rear surface BS of the display panel DP after being bent at the bending area BA.

Hereinafter, locations of the configurations illustrated in FIG. 15 are expressed by "on" and "under" with reference to the cross-section of FIG. 13. Furthermore, locations of the configurations illustrated in FIGS. 16 and 17 are expressed by "on" and "under" with reference to the cross-section of FIG. 14.

Referring to FIGS. 13 and 15, the printed circuit board PCB may be disposed between the panel steps PST on one side OS of the second area AA2. The printed circuit board PCB may have a "T" shape, but the shape of the printed circuit board PCB is not limited thereto.

The timing controller T-CON and a plurality of elements ELT may be disposed on the printed circuit board PCB. The elements ELT may include various suitable elements, for example, such as a resistor and a capacitor. The timing controller T-CON and the elements ELT may be disposed at a portion of the printed circuit board PCB, which extends in the second direction DR2.

Referring to FIGS. 14, 16, 17, and 18, the bending area BA may be bent, and the printed circuit board PCB may be disposed under the first area AA1 of the display panel DP. The insulation tape ITP and the spacer SPC may be disposed under the first area AA1.

When viewed on the plane (e.g., in a plan view), the spacer SPC may overlap with the second area AA2. The spacer SPC may include a first part PT1, a second part PT2, and a third part PT3. The first part PT1 may be disposed at (e.g., in or on) the second area AA2, and may extend in the second direction DR2. When viewed on the plane (e.g., in a plan view), the first part PT1 may overlap with the mounting part MP.

Opposite sides of the first part PT1, which are opposite to each other in the second direction DR2, may be disposed on an outside of the mounting part MP. Accordingly, when viewed on the plane (e.g., in the plan view), the opposite sides of the first part PT1 may not overlap with the mounting part MP. However, the present disclosure is not limited thereto, and the opposite sides of the first part PT1, which are opposite to each other in the second direction DR2, may overlap with opposite sides of the mounting part MP, which are opposite to each other in the second direction DR2.

The second part PT2 may protrude from the first part PT1 in the first direction DR1, and may extend in the second direction DR2. The second part PT2 may be adjacent to the one side OS of the second area AA2. The second part PT2 may overlap with the bonding part BDP. The second part PT2 may be disposed on an inside of the one side OS of the second area AA2. The second part PT2 may extend to cross the panel steps PST in the second direction DR2

The second part PT2 may be stepped with the first part PT1. With respect to the second direction DR2, a length L2 of the second part PT2 may be smaller than a length L1 of the first part PT1. Due to this structure, the opposite sides of the second part PT2, which are opposite to each other in the second direction DR2, may be stepped with the first part PT1. The opposite sides of the second part PT2 stepped with the first part PT1 may be defined as steps STP.

When viewed on the plane (e.g., in a plan view), the opposite sides of the second part PT2, which are opposite to each other in the second direction DR2, may not overlap with the second area AA2, but may be disposed on an outside of the second area AA2. In other words, the steps STP, when viewed on the plane (e.g., in a plan view), may not overlap with the second area AA2, and may be disposed on an outside of the second area AA2.

The steps STP may be spaced apart from the panel steps PST in the second direction DR2. The steps STP may be adjacent to a portion of the mounting part MP in the first direction DR1, the portion of the mounting part MP extending further than the bonding part BDP in the second direction. The bonding part BDP may be disposed between the steps STP in the second direction DR2.

The steps STP may have symmetrical or substantially symmetrical inclined side surfaces. One side of the second part PT2, which is adjacent to the one side OS and overlaps with the bonding part BDP, may extend in the second direction DR2. The inclined side surfaces of the steps STP may have an inclined surface that define an obtuse angle with the one side of the second part PT2.

The third part PT3 may protrude from the first part PT1 in the first direction DR1, and may extend in the second direction DR2. The third part PT3 may protrude in an opposite direction from that of the second part PT2. The third part PT3 may be stepped with the first part PT1. With respect to the second direction DR2, a length L3 of the third part PT3 may be smaller than the length L1 of the first part PT1. Due to this structure, the opposite sides of the third part PT3, which are opposite to each other in the second direction DR2, may be stepped with the first part PT1.

The length L3 of the third part PT3 may be smaller than the length L2 of the second part PT2. The third part PT3 may be adjacent to the bending area BA. When viewed on the plane (e.g., in a plan view), the third part PT3 may overlap with the bending area BA.

The insulation tape ITP may be disposed under the spacer SPC, the second area AA2, and the printed circuit board PCB. The insulation tape ITP may be disposed under the second area AA2, and may extend to a lower side of a portion of the printed circuit board PCB under the second area AA2.

The insulation tape ITP may include a first extension part EX1 extending in the second direction DR2, a second extension part EX2 protruding from the first extension part EX1 in the first direction DR1, and a third extension part EX3 protruding from the second extension part EX2 in the first direction DR1.

The first extension part EX1 may be disposed under the mounting part MP. When viewed on the plane (e.g., in a plan view), the first extension part EX1 may overlap with the mounting part MP. The second extension part EX2 may be disposed under the bonding part BDP. When viewed on the plane (e.g., in a plan view), the second extension part EX2 may overlap with the bonding part BDP. The third extension part EX3 may be disposed under a portion of the printed circuit board PCB. When viewed on the plane (e.g., in a plan view), the third extension part EX3 may overlap with a portion of the printed circuit board PCB, in which the timing controller T-CON and the elements ELT are not disposed.

When viewed on the plane (e.g., in a plan view), an edge of the first extension part EX1 may be disposed on an inside of an edge of the mounting part MP. Portions of the first extension part EX1, which are adjacent to the opposite sides of the second extension part EX2, which are opposite to each other in the second direction DR2, may be defined as dummy steps DST having a shape that is recessed in the first direction DR1 and is stepped.

The display device DD may further include a plurality of resin layers RIN disposed under the first area AA1. When viewed on the plane (e.g., in a plan view), the resin layers RIN may be spaced apart from the panel steps PST in the second direction DR2. The bonding part BDP may be disposed between the resin layers RIN in the second direction DR2. For example, two resin layers RIN are illustrated, but the number of resin layers RIN is not limited thereto. For example, at least one resin layer RIN may be disposed under the first area AA1.

As illustrated in FIG. 18, the resin layers RIN may cover some edges of the spacer SPC that are spaced apart from the panel steps PST. The resin layers RIN may cover the steps while overlapping with the steps STP. The resin layers RIN may cover edges of the first and second parts PT1 and PT2, which are spaced apart from the panel steps PST and are adjacent to the steps STP.

The resin layers RIN may cover some edges of the insulation tape ITP, which are spaced apart from the panel steps PST. For example, the resin layers RIN may cover some edges of the first extension part EX1, which are spaced apart from the panel steps PST. The resin layers RIN may cover some edges of the mounting part MP, which are spaced apart from the panel steps PST.

By the resin layers RIN, the insulation tape ITP may be fixed to the spacer SPC more easily. By the resin layers RIN, the mounting part MP may be fixed to the spacer SPC more easily.

A portion of the display panel DP, at which the bending area BA is disposed, may be defined as a lower end of the display panel DP. The lower end of the display panel DP may be disposed toward a ground surface, and when the display panel DP falls onto the ground surface, an impact may be applied to the lower end of the display panel DP. For example, an impact may be applied to opposite corners of the lower end of the display panel DP. The structure having the stepped shape may be vulnerable to an external impact. When an impact force is delivered to the panel steps PST, stresses of the panel steps PST may increase. Due to the stresses, the panel steps PST may be damaged.

The display panel DP may generate an image, and when the panel steps PST are damaged, the elements of the display panel DP may be damaged together. Accordingly, an image may not be normally displayed.

In an embodiment of the present disclosure, the steps STP of the spacer SPC attached to the second area AA2 may be disposed on an outside of the panel steps PST. In this case, when an impact is applied to the lower end of the display panel DP, an impact force may be applied to the steps STP earlier than to the panel steps PST. The impact force may be absorbed by the steps STP first, and the impact force delivered to the panel steps PST may be decreased. When the steps STP have inclined surfaces rather than vertical side surfaces, surface areas thereof are increased, and the impact force may be further absorbed by the steps STP having the inclined surfaces. Accordingly, damage to the panel steps PST may be prevented or substantially prevented.

In an embodiment of the present disclosure, the resin layers RIN cover the steps STP, and thus, the impact force delivered to the steps STP may be absorbed by the resin layer RIN. Accordingly, due to the resin layer RIN, damage to the steps STP may be prevented or substantially prevented. Furthermore, because the impact force is further absorbed by the resin layer RIN as well as by the steps STP, the impact force delivered to the panel steps PST may be further decreased.

Figure 19:
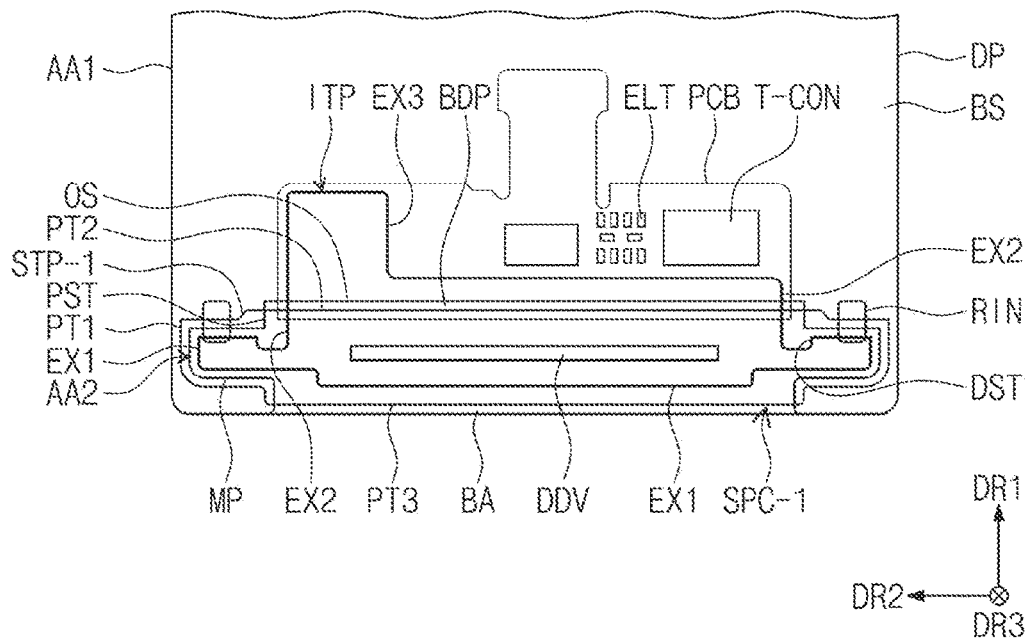
FIG. 19 is a view illustrating a configuration of a spacer according to another embodiment of the present disclosure.

FIG. 19 is a view illustrating a configuration of a spacer according to another embodiment of the present disclosure.

As an example, FIG. 19 illustrates a plane (e.g., a plan view) corresponding to FIG. 17. Hereinafter, a configuration of a spacer SPC-1 will be mainly described in relation to differences from the spacer SPC illustrated in FIG. 17, and thus, redundant description thereof may not be repeated.

Referring to FIG. 19, the resin layers RIN may cover some edges of the spacer SPC-1, which are spaced apart from the panel steps PST, and some edges of the first extension part EX1, which are spaced apart from the panel steps PST. The resin layers RIN may cover some edges of the first part PT1, which are spaced apart from the panel steps PST.

Unlike the configuration illustrated in FIG. 17, steps STP-1 of the spacer SPC-1 may be spaced apart from the resin layers RIN. When viewed on the plane (e.g., in a plan view), the resin layers RIN may not overlap with the steps STP-1.

Figure 20:
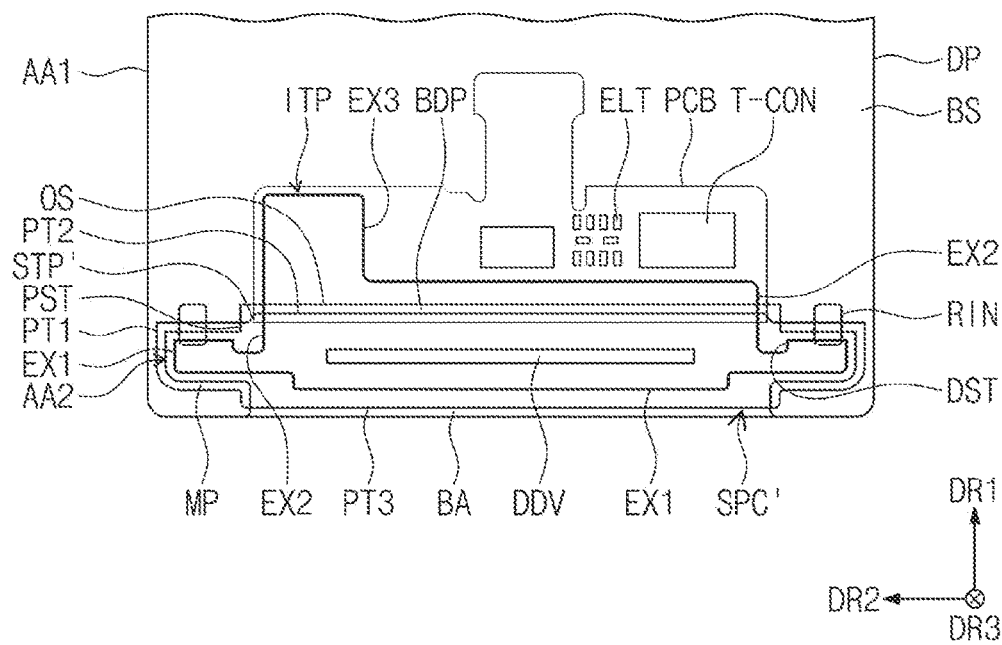
FIG. 20 is a view illustrating a configuration of a comparative spacer according to a comparative example.

FIG. 20 is a view illustrating a configuration of a comparative spacer according to a comparative example.

As an example, FIG. 20 illustrates a plane (e.g., a plan view) corresponding to FIG. 17, and illustrates a portion of the display panel DP at which a step STP' is disposed.

Referring to FIG. 20, unlike the steps STP and STP-1 illustrated in FIGS. 17 and 19, the step STP' of a comparative spacer SPC' may not be disposed on an outside of the second area AA2. When viewed on the plane (e.g., in a plan view), the step STP' may be disposed on the second area AA2 while overlapping with the second area AA2.

In the following, Table 1 represents values obtained by measuring stresses of the panel steps PST according to the steps STP, STP-1, and STP' illustrated in FIGS. 17, 19, and 20 when an impact is applied to a lower end of the display panel DP. The unit of the stresses may be MPa.

TABLE 1

| Test items | Step (STP') | Step (STP-1) | Step (STP) |
|---|---|---|---|
| Stresses (MPa) | 271 | 235 | 210 |

In Table 1, when the steps STP' of the comparative spacer SPC' were used, the measured stresses of the panel steps PST were 271 MPa. When the steps STP-1 according to an embodiment of the present disclosure were used, the measured stresses of the panel steps PST were 235 MPa. When the steps STP according to an embodiment of the present disclosure were used, the measured stresses of the panel steps PST were 210 MPa. When the steps STP and STP-1 are disposed on an outside of the second area AA2, the stresses of the panel steps PST may be decreased. Accordingly, damage to the panel steps PST may be reduced.

Figure 21:
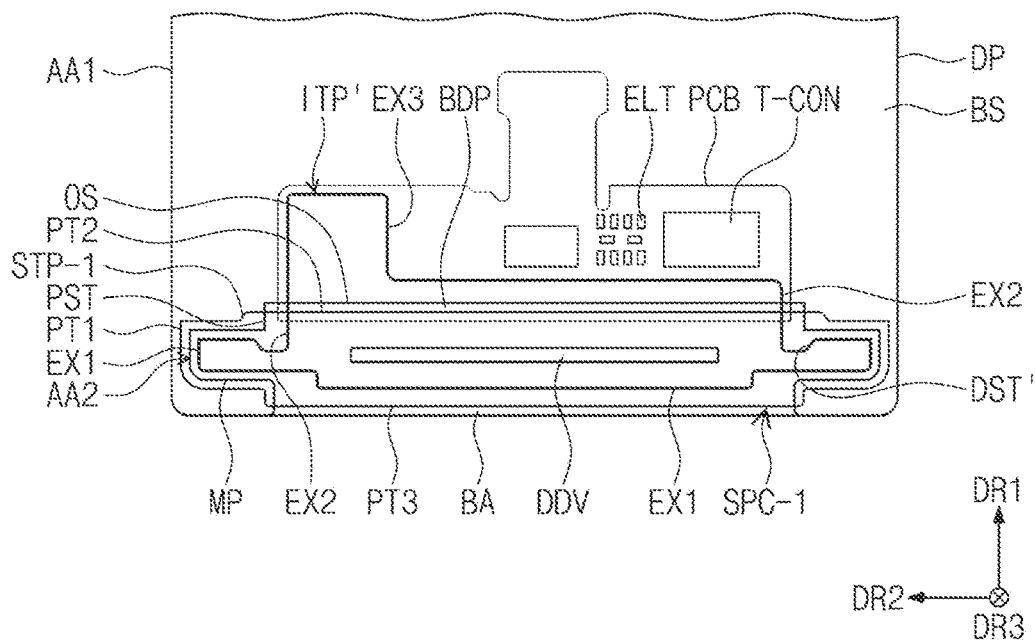
FIG. 21 is a view illustrating configurations of a spacer and an insulation tape according to another embodiment of the present disclosure.
Figure 22:
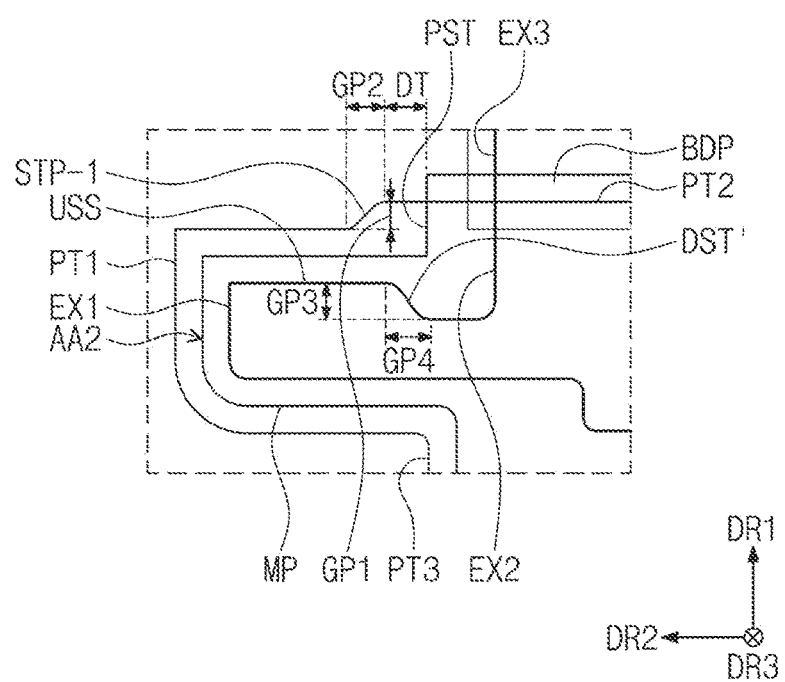
FIG. 22 is an enlarged view of a dummy step and a surrounding of the dummy step illustrated in FIG. 21.

FIG. 21 is a view illustrating configurations of a spacer and an insulation tape according to another embodiment of the present disclosure. FIG. 22 is an enlarged view of a dummy step and a surrounding of the dummy step illustrated in FIG. 21.

As an example, FIG. 21 illustrates a plane (e.g., a plan view) corresponding to FIG. 19. Hereinafter, the configurations illustrated in FIGS. 21 and 22 will be described mainly in relation to differences from the configuration illustrated in FIG. 19, and the same configurations are denoted by the same reference symbols, and thus, redundant description thereof may not be repeated.

Referring to FIGS. 21 and 22, unlike in FIG. 19, the resin layers RIN may not be disposed on the spacer SPC-1. Portions of the first extension part EX1, which are adjacent to the opposite sides of the second extension part EX2, which are opposite to each other in the second direction DR2, may be defined as dummy steps DST or DST' having a shape that is recessed in the first direction DR1 and is stepped.

Side surfaces of the dummy steps DST', which face opposite sides of the second extension part EX2, may have symmetrical or substantially symmetrical inclined surfaces, and may be adjacent to the panel steps PST. An upper side USS of the first extension part EX1 may extend in the second direction DR2. The dummy steps DST' may have inclined surfaces that define an obtuse angle with the upper side USS of the first extension part EX1. According to this structure, intervals between the side surfaces of the dummy steps DST', which face the opposite sides of the second extension part EX2, and the opposite sides of the second extension part EX2 may become smaller as they become closer to the bending area BA.

Referring to FIG. 22, a first interval GP1 between upper ends and lower ends of the step STP-1 in the first direction DR1 may be 0.34 mm. A second gap GP2 between an upper end and a lower end of the step STP-1 in the second direction DR2 may be 0.54 mm. A spacing distance DT between the upper end of the step STP-1 and the panel step PST in the second direction DR2 may be 0.6 mm.

A third gap GP3 between the upper end and the lower end of the dummy step DST' having the inclined surface in the first direction DR1 may be 1.13 mm. A fourth gap GP4 between the upper end and the lower end of the step DST' in the second direction DR2 may be 1.25 mm.

Referring to FIGS. 21 and 22, in an embodiment of the present disclosure, the dummy steps DST' of the insulation tape ITP attached to the second area AA2 may be disposed on an outside of the panel steps PST. When an impact is applied to the lower end of the display panel DP, an impact force may be applied to the dummy steps DST' earlier than to the panel steps PST. Accordingly, the impact force may be absorbed first by the dummy steps DST'. Because the dummy steps DST' have the inclined surfaces, the impact force may be easily absorbed by the dummy steps DST'. Accordingly, damage to the panel steps PST may be prevented or substantially prevented.

Figure 23:
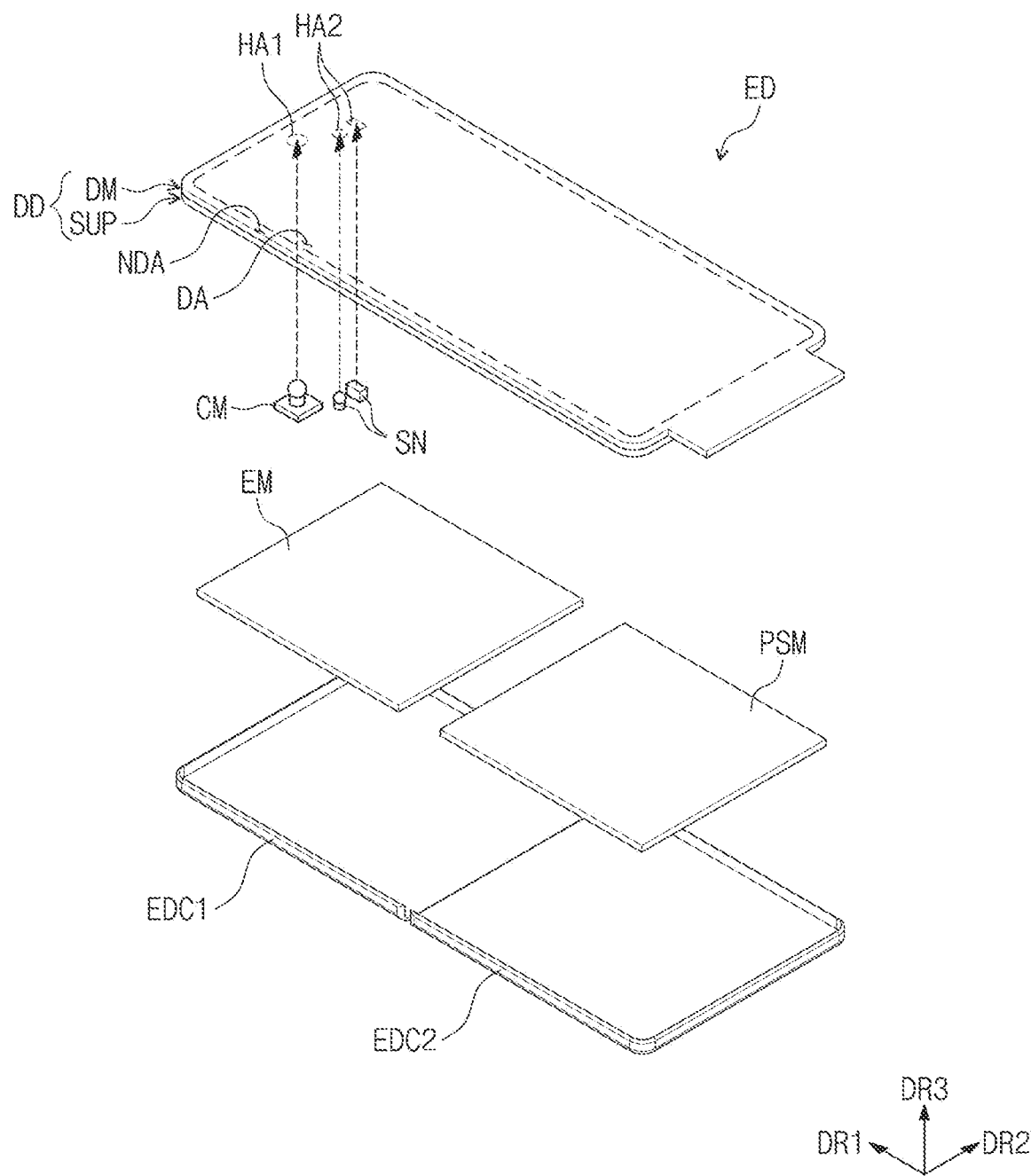
FIG. 23 is an exploded perspective view of the electronic device illustrated in FIG. 1.

FIG. 23 is an exploded perspective view of the electronic device illustrated in FIG. 1.

Referring to FIG. 23, the electronic device ED may include the display device DD, the camera CM, the sensors SN, an electronic module (e.g., an electronic device) EM, a power supply module (e.g., a power supply or a power supply device) PSM, and cases EDC1 and EDC2. The display device DD may include the display module DM and the support SUP. The configurations of the display module DM and the support SUP may be the same or substantially the same as those described above with reference to FIGS. 4 and 5, and thus, redundant description thereof may not be repeated. The electronic device ED may further include mechanical structures for controlling a folding operation of the display device DD.

The camera CM and the sensors SN may be disposed under (e.g., underneath) the display device DD. As described above, the first and second hole areas HA1 and HA2 may be defined in the display device DD, the camera CM may be disposed in the first hole area HA1, and the sensors SN may be disposed in the second hole areas HA2.

The electronic module EM and the power supply module PSM may be disposed under (e.g., underneath) the display device DD. The electronic module EM and the power supply module PSM may be connected to each other through a flexible circuit board. The electronic module EM may control an operation of the display device DD. The power supply module PSM may supply electric power to the electronic module EM.

The cases EDC1 and EDC2 may accommodate the display device DD, the electronic module EM, and the power supply module PSM. The cases EDC1 and EDC2 may be classified into two first and second cases EDC1 and EDC2 to fold the display device DD. The cases EDC1 and EDC2 may protect the display device DD, the electronic module EM, and the power supply module PSM.

Figure 24:
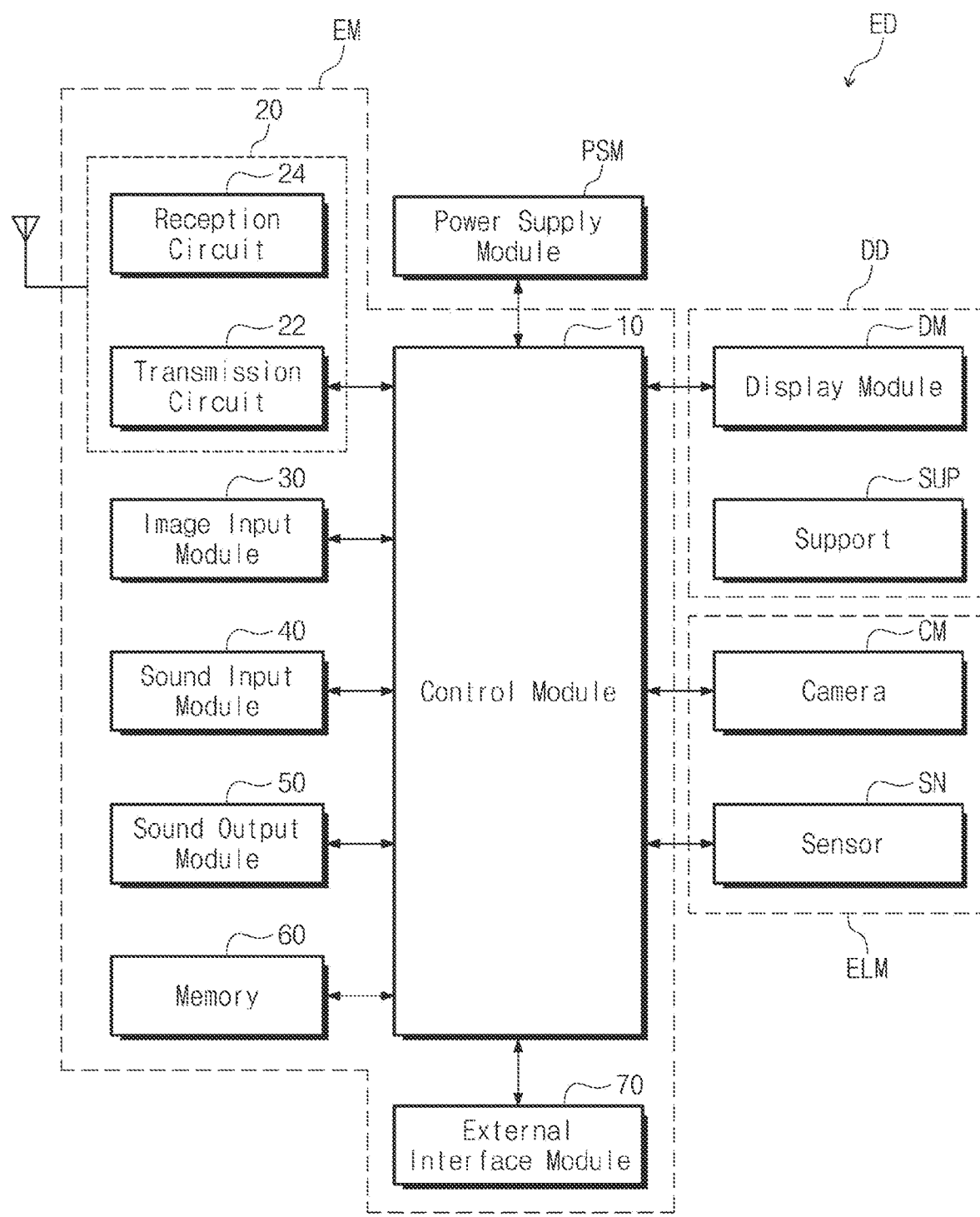
FIG. 24 is a block diagram of the electronic device illustrated in FIG. 23.

FIG. 24 is a block diagram of the electronic device illustrated in FIG. 23.

Referring to FIG. 24, the electronic module EM may include a control module (e.g., a controller) 10, a wireless communication module (e.g., a wireless communication device) 20, an image input module (e.g., an image input device) 30, a sound input module (e.g., a sound input device) 40, a sound output module (e.g., a sound output device) 50, a memory 60, and an external interface module (e.g., an external interface) 70. The modules may be mounted on a circuit board, or may be electrically connected to each other through a flexible circuit board. The electronic module EM may be electrically connected to the power supply module PSM.

The control module 10 may control an overall operation of the electronic device ED. For example, the control module 10 may activate or deactivate the display device DD according to a user input. The control module 10 may control the image input module 30, the sound input module 40, and the sound output module 50 according to the user input. The control module 10 may include at least one microprocessor.

The wireless communication module 20 may transmit/receive a wireless signal with another terminal by using a Bluetooth or Wi-Fi line. The wireless communication module 20 may transmit/receive a voice signal by using a general communication line. The wireless communication module 20 may include a transmission circuit 22 that modulates a signal to be transmitted and transmits the signal, and a reception circuit 24 that demodulates the received signal.

The image input module 30 processes the image signal and converts the processed image signal to image data that may be displayed on the display device DD. The sound input module 40 may receive an external sound signal through a microphone and convert the sound signal into electrical sound data in a recording mode or a sound recognition mode. The sound output module 50 may convert the sound data received from the wireless communication module 20 or the sound data stored in the memory 60 and output the sound data to the outside.

The external interface module 70 may function as an interface connected to an external charger, a wired/wireless data port, a card socket (for example, a memory card or an SIM/UIM card), and the like.

The power supply module PSM supplies electric power that is used for an overall operation of the electronic device ED. The power supply module PSM may include a general battery device.

An electronic optical module (e.g., an electronic optical device) ELM may be an electronic component that outputs or receives a light signal. The electronic optical module ELM transmits or receives the light signal through a partial area of the display device DD. In the embodiment, the electronic optical module ELM may include the camera CM. The camera CM may receive natural light and photograph an external image. The electronic optical module ELM may include the sensor SN, for example, such as a proximity sensor.

According to embodiments of the present disclosure, because the step of the spacer may be disposed at (e.g., in or on) an outside of the panel step of the display panel (e.g., in a plan view), an impact force may be delivered to the step of the spacer first when the display device is dropped or falls, and thus, damage to the panel step may be prevented or substantially prevented.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
a display panel including a first area, a bending area, and a second area arranged along a first direction, the second area being configured to be located underneath the first area in a thickness direction when the bending area is bent; and
a spacer between the first area and the second area, and comprising:
a first part; and
a second part protruding from the first part in the first direction,
wherein opposite sides of the second part in a second direction that crosses the first direction and the thickness direction define steps that are stepped from the first part along the second direction, and the steps are located at an outside of the second area in a plan view.

2. The display device of claim 1, wherein the second area comprises:
a mounting part extending in the second direction; and
a bonding part protruding from the mounting part in the first direction, and
wherein opposite sides of the bonding part in the second direction define panel steps that are stepped from the mounting part.

3. The display device of claim 2, wherein the steps are spaced from the panel steps in the second direction.

4. The display device of claim 2, wherein:
the second part extends in the second direction to cross the panel steps in the second direction;
a portion of the mounting part extends further in the second direction than the bonding part; and
the steps are adjacent in the first direction to the portion of the mounting part that extends further in the second direction than the bonding part.

5. The display device of claim 2, wherein the steps have inclined surfaces that form an obtuse angle with one side of the second part that extends in the second direction while overlapping with the bonding part.

6. The display device of claim 2, further comprising:
resin layers spaced from the panel steps in a plan view,
wherein the resin layers cover portions of edges of the spacer that are spaced from the panel steps, respectively.

7. The display device of claim 6, wherein the resin layers overlap with the steps in a plan view.

8. The display device of claim 6, wherein the resin layers do not overlap with the steps in a plan view.

9. The display device of claim 2, further comprising:
a driving part under the mounting part;
a printed circuit board connected to the bonding part; and
an insulation tape under the second area to cover the driving part, and extending to a lower side of the printed circuit board.

10. The display device of claim 9, wherein the insulation tape comprises:
a first extension part under the mounting part and extending in the second direction;
a second extension part under the bonding part, and protruding from the first extension part in the first direction; and
a third extension part under a portion of the printed circuit board, and protruding from the second extension part in the first direction.

11. The display device of claim 10, further comprising:
resin layers spaced from the panel steps in a plan view,
wherein the resin layers cover portions of edges of the spacer that are spaced from the panel steps, respectively, and portions of edges of the first extension part that are spaced from the panel steps, respectively.

12. The display device of claim 10, wherein portions of the first extension part that are adjacent to opposite sides of the second extension part, which are opposite to each other in the second direction, define dummy steps having a shape that is recessed in the first direction to be stepped, and
wherein side surfaces of the dummy steps that face the opposite sides of the second extension part have inclined surfaces and are adjacent to the panel steps.

13. The display device of claim 12, wherein intervals between the side surfaces of the dummy steps and the opposite sides of the second extension part become smaller as they become closer to the bending area.

14. The display device of claim 2, wherein the spacer further comprises a third part that protrudes from the first part in an opposite direction from that of the second part in the first direction, and is stepped from the first part, and
wherein the first part overlaps with the mounting part, the third part overlaps with the bending area, and the second part overlaps with the bonding part.

15. The display device of claim 14, wherein the second part and the third part have lengths in the second direction that are smaller than that of the first part, and the third part has a length in the second direction that is smaller than that of the second part.

16. The display device of claim 1, further comprising:
a first support plate under the first area;
a second support plate under the first support plate; and
a heat dissipating layer between the first support plate and the second support plate,
wherein the spacer is located under the second support plate, and one side of the spacer that is adjacent to the bending area overlaps with one side of the second support plate that is adjacent to the bending area.

17. A display device comprising:
a display panel including a first area, a bending area, and a second area arranged along a first direction, the second area being configured to be located underneath the first area when the bending area is bent; and
a spacer between the first area and the second area, and comprising:
a first part extending to an outside of the second area; and
a second part protruding from the first part in the first direction,
wherein the second area comprises:
a mounting part overlapping with the first part in a plan view; and
a bonding part protruding from the mounting part in the first direction, and overlapping with the second part, and
wherein opposite sides of the second part in a second direction that crosses the first direction define steps that are stepped from the first part, and the bonding part is between the steps in the second direction in a plan view.

18. The display device of claim 17, further comprising:
a printed circuit board connected to one side of the second area;
an insulation tape under the second area and extending to a lower side of a portion of the printed circuit board; and
a resin layer covering portions of edges of the spacer that are spaced apart from panel steps, respectively, and portions of edges of the insulation tape that are spaced apart from the panel steps, respectively, in a plan view.

19. The display device of claim 18, wherein the resin layer overlaps with at least one of the steps in a plan view.

20. An electronic device comprising:
a display device having a first hole area through which an optical signal passes;
an electronic optical module under the display device and overlapping with the first hole area, the electronic optical module being configured to receive the optical signal; and
a case configured to accommodate the display device and the electronic optical module,
wherein the display device comprises:
a display panel including a first area, a bending area, and a second area arranged along a first direction, the second area being configured to be located underneath the first area in a thickness direction when the bending area is bent; and
a spacer between the first area and the second area, and comprising:
a first part; and
a second part protruding from the first part in the first direction, and wherein opposite sides of the second part in a second direction that crosses the first direction and the thickness direction define steps that are stepped from the first part along the second direction, and the steps are located at an outside of the second area in a plan view.

* * * * *